(12) United States Patent
Rajan

(10) Patent No.: US 7,515,453 B2
(45) Date of Patent: Apr. 7, 2009

(54) INTEGRATED MEMORY CORE AND MEMORY INTERFACE CIRCUIT

(75) Inventor: Suresh N. Rajan, San Jose, CA (US)

(73) Assignee: MetaRAM, Inc., San Jose, CA (US)

( * ) Notice: Subject to any disclaimer, the term of this patent is extended or adjusted under 35 U.S.C. 154(b) by 235 days.

(21) Appl. No.: 11/474,075

(22) Filed: Jun. 23, 2006

(65) Prior Publication Data

US 2007/0050530 A1    Mar. 1, 2007

Related U.S. Application Data

(60) Provisional application No. 60/693,631, filed on Jun. 24, 2005.

(51) Int. Cl.
*G11C 5/06* (2006.01)
(52) U.S. Cl. .............................. 365/63; 712/37; 712/38
(58) Field of Classification Search .................. 365/63; 712/37, 38
See application file for complete search history.

(56) References Cited

U.S. PATENT DOCUMENTS

| | | | |
|---|---|---|---|
| 4,525,921 A | 7/1985 | Carson et al. | 29/577 |
| 4,592,019 A | 5/1986 | Huang et al. | 365/78 |
| 4,646,128 A | 2/1987 | Carson et al. | 357/74 |
| 4,698,748 A | 10/1987 | Juzswik et al. | 364/200 |
| 4,706,166 A | 11/1987 | Go | 361/403 |
| 4,710,903 A | 12/1987 | Hereth et al. | 365/194 |
| 4,764,846 A | 8/1988 | Go | 361/388 |
| 4,780,843 A | 10/1988 | Tietjen | 364/900 |
| 4,841,440 A | 6/1989 | Yonezu et al. | 364/200 |
| 4,884,237 A | 11/1989 | Mueller et al. | 365/63 |
| 4,935,734 A | 6/1990 | Austin | 340/825.83 |
| 4,982,265 A | 1/1991 | Watanabe et al. | 357/75 |
| 4,983,533 A | 1/1991 | Go | 437/7 |
| 5,083,266 A | 1/1992 | Watanabe | 395/275 |

(Continued)

FOREIGN PATENT DOCUMENTS

DE    102004053316    5/2006

(Continued)

OTHER PUBLICATIONS

Written Opinion of the International Searching Authority for Related Foreign Application PCT/US2006/024360.

(Continued)

*Primary Examiner*—Viet Q Nguyen
(74) *Attorney, Agent, or Firm*—Zilka-Kotab, PC

(57) ABSTRACT

A memory device comprises a first and second integrated circuit dies. The first integrated circuit die comprises a memory core as well as a first interface circuit. The first interface circuit permits full access to the memory cells (e.g., reading, writing, activating, pre-charging and refreshing operations to the memory cells). The second integrated circuit die comprises a second interface that interfaces the memory core, via the first interface circuit, an external bus, such as a synchronous interface to an external bus. A technique combines memory core integrated circuit dies with interface integrated circuit dies to configure a memory device. A speed test on the memory core integrated circuit dies is conducted, and the interface integrated circuit die is electrically coupled to the memory core integrated circuit die based on the speed of the memory core integrated circuit die.

27 Claims, 16 Drawing Sheets

U.S. PATENT DOCUMENTS

| | | | |
|---|---|---|---|
| 5,104,820 A | 4/1992 | Go et al. | 437/51 |
| 5,220,672 A | 6/1993 | Nakao et al. | 395/750 |
| 5,252,807 A | 10/1993 | Chizinsky | 219/390 |
| 5,257,233 A | 10/1993 | Schaefer | 365/227 |
| 5,278,796 A | 1/1994 | Tillinghast et al. | 365/211 |
| 5,282,177 A | 1/1994 | McLaury | 365/230 |
| 5,347,428 A | 9/1994 | Carson et al. | 361/760 |
| 5,384,745 A | 1/1995 | Konishi et al. | 365/230.03 |
| 5,388,265 A | 2/1995 | Volk | 395/750 |
| 5,432,729 A | 7/1995 | Carson et al. | 365/63 |
| 5,448,511 A | 9/1995 | Paurus et al. | 365/52 |
| 5,453,434 A | 9/1995 | Albaugh et al. | 514/397 |
| 5,467,455 A | 11/1995 | Gay et al. | 395/281 |
| 5,502,667 A | 3/1996 | Bertin et al. | 365/51 |
| 5,526,320 A | 6/1996 | Zagar et al. | 365/233 |
| 5,530,836 A | 6/1996 | Busch et al. | 395/477 |
| 5,559,990 A | 9/1996 | Cheng et al. | 395/484 |
| 5,561,622 A | 10/1996 | Bertin et al. | 365/51 |
| 5,563,086 A | 10/1996 | Bertin et al. | 437/52 |
| 5,566,344 A * | 10/1996 | Hall et al. | 712/37 |
| 5,581,498 A | 12/1996 | Ludwig et al. | 365/63 |
| 5,581,779 A * | 12/1996 | Hall et al. | 712/43 |
| 5,590,071 A | 12/1996 | Kolor et al. | 365/149 |
| 5,598,376 A | 1/1997 | Merritt et al. | 365/230 |
| 5,604,714 A | 2/1997 | Manning et al. | 365/230 |
| 5,606,710 A * | 2/1997 | Hall et al. | 712/38 |
| 5,608,262 A | 3/1997 | Degani et al. | 257/723 |
| 5,610,864 A | 3/1997 | Manning | 365/193 |
| 5,623,686 A * | 4/1997 | Hall et al. | 712/32 |
| 5,627,791 A | 5/1997 | Wright et al. | 365/222 |
| 5,640,337 A * | 6/1997 | Huang et al. | 703/23 |
| 5,640,364 A | 6/1997 | Merritt et al. | 365/233 |
| 5,652,724 A | 7/1997 | Manning | 365/189 |
| 5,661,677 A | 8/1997 | Rondeau et al. | 365/63 |
| 5,661,695 A | 8/1997 | Zagar et al. | 365/233 |
| 5,668,773 A | 9/1997 | Zagar et al. | 365/233 |
| 5,675,549 A | 10/1997 | Ong et al. | 365/233 |
| 5,680,342 A | 10/1997 | Frankeny | 365/52 |
| 5,682,354 A | 10/1997 | Manning | 365/233 |
| 5,692,202 A | 11/1997 | Kardach et al. | 395/750 |
| 5,696,732 A | 12/1997 | Zagar et al. | 365/233 |
| 5,702,984 A | 12/1997 | Bertin et al. | 437/208 |
| 5,703,813 A | 12/1997 | Manning et al. | 365/189 |
| 5,706,247 A | 1/1998 | Merritt et al. | 365/233 |
| 5,717,654 A | 2/1998 | Manning | 365/233 |
| 5,721,859 A | 2/1998 | Manning | 397/421 |
| 5,724,288 A | 3/1998 | Cloud et al. | 365/193 |
| 5,729,503 A | 3/1998 | Manning | 365/233 |
| 5,748,914 A | 5/1998 | Barth et al. | 395/285 |
| 5,752,045 A | 5/1998 | Chen | 395/750 |
| 5,757,703 A | 5/1998 | Merritt et al. | 365/189 |
| 5,798,961 A | 8/1998 | Heyden et al. | 365/52 |
| 5,802,010 A | 9/1998 | Zagar et al. | 365/233 |
| 5,812,488 A | 9/1998 | Zagar et al. | 365/233 |
| 5,831,931 A | 11/1998 | Manning | 365/233 |
| 5,831,932 A | 11/1998 | Merritt et al. | 365/233 |
| 5,835,435 A | 11/1998 | Bogin et al. | 365/227 |
| 5,838,165 A | 11/1998 | Chatter | |
| 5,838,177 A | 11/1998 | Keeth | 327/108 |
| 5,843,807 A | 12/1998 | Burns | 438/109 |
| 5,845,108 A | 12/1998 | Yoo et al. | 395/551 |
| 5,850,368 A | 12/1998 | Ong et al. | 365/238 |
| 5,859,792 A | 1/1999 | Rondeau et al. | 365/52 |
| 5,860,106 A | 1/1999 | Domen et al. | 711/137 |
| 5,870,347 A | 2/1999 | Keeth et al. | 365/230 |
| 5,875,142 A | 2/1999 | Chevallier | 365/212 |
| 5,884,088 A | 3/1999 | Kardach et al. | 395/750 |
| 5,901,105 A | 5/1999 | Ong et al. | 365/230 |
| 5,903,500 A | 5/1999 | Tsang et al. | 365/189.05 |
| 5,905,688 A | 5/1999 | Park | 365/227 |
| 5,907,512 A | 5/1999 | Parkinson et al. | 365/195 |
| 5,915,105 A | 6/1999 | Farmwald et al. | 395/309 |
| 5,917,758 A | 6/1999 | Keeth | 365/189.05 |
| 5,923,611 A | 7/1999 | Ryan | 365/233 |
| 5,926,452 A | 7/1999 | Park et al. | 365/233 |
| 5,943,254 A | 8/1999 | Bakeman, Jr. et al. | 365/72 |
| 5,946,265 A | 8/1999 | Cowles | 365/233 |
| 5,949,254 A | 9/1999 | Keeth | 326/87 |
| 5,953,215 A | 9/1999 | Karabatsos | 361/767 |
| 5,953,263 A | 9/1999 | Farmwald et al. | 365/194 |
| 5,954,804 A | 9/1999 | Farmwald et al. | 710/36 |
| 5,956,233 A | 9/1999 | Yew et al. | 361/760 |
| 5,962,435 A | 10/1999 | Mao et al. | 514/63 |
| 5,963,463 A | 10/1999 | Rondeau et al. | 365/52 |
| 5,963,464 A | 10/1999 | Dell et al. | 365/52 |
| 5,963,504 A | 10/1999 | Manning | 365/233 |
| 5,966,724 A | 10/1999 | Ryan | 711/105 |
| 5,973,392 A | 10/1999 | Senba et al. | 257/686 |
| 5,995,443 A | 11/1999 | Farmwald et al. | 365/233 |
| 6,001,671 A | 12/1999 | Fjelstad | 438/112 |
| 6,002,613 A | 12/1999 | Cloud et al. | 365/189 |
| 6,002,627 A | 12/1999 | Chevallier | 365/212 |
| 6,014,339 A | 1/2000 | Kobayashi et al. | 365/233 |
| 6,016,282 A | 1/2000 | Keeth | 365/233 |
| 6,032,214 A | 2/2000 | Farmwald et al. | 710/129 |
| 6,032,215 A | 2/2000 | Farmwald et al. | 710/129 |
| 6,034,916 A | 3/2000 | Lee | 365/233 |
| 6,034,918 A | 3/2000 | Farmwald et al. | 365/233 |
| 6,035,365 A | 3/2000 | Farmwald et al. | 710/129 |
| 6,038,195 A | 3/2000 | Farmwald et al. | 365/233 |
| 6,038,673 A | 3/2000 | Benn et al. | 713/323 |
| 6,044,032 A | 3/2000 | Li | 365/230 |
| 6,069,504 A | 5/2000 | Keeth | 327/108 |
| 6,070,217 A | 5/2000 | Connolly et al. | 710/131 |
| 6,073,223 A | 6/2000 | McAllister et al. | 711/167 |
| 6,075,730 A | 6/2000 | Barth et al. | 365/191 |
| 6,078,546 A | 6/2000 | Lee | 365/233 |
| 6,079,025 A | 6/2000 | Fung | 713/323 |
| 6,084,434 A | 7/2000 | Keeth | 326/87 |
| 6,088,290 A | 7/2000 | Ohtake et al. | 365/233 |
| RE36,839 E | 8/2000 | Simmons et al. | 326/93 |
| 6,101,152 A | 8/2000 | Farmwald et al. | 365/233 |
| 6,101,612 A | 8/2000 | Jeddeloh | 713/401 |
| 6,108,795 A | 8/2000 | Jeddeloh | 713/401 |
| 6,154,370 A | 11/2000 | Degani et al. | 361/761 |
| 6,166,991 A | 12/2000 | Phelan | 365/233 |
| 6,182,184 B1 | 1/2001 | Farmwald et al. | 710/129 |
| 6,208,168 B1 | 3/2001 | Rhee | 326/83 |
| 6,222,739 B1 | 4/2001 | Bhakta et al. | 361/790 |
| 6,233,192 B1 | 5/2001 | Tanaka | 365/222 |
| 6,240,048 B1 | 5/2001 | Matsubara | 365/233 |
| 6,243,282 B1 | 6/2001 | Rondeau et al. | 365/52 |
| 6,252,807 B1 | 6/2001 | Suzuki et al. | 365/193 |
| 6,260,097 B1 | 7/2001 | Farmwald et al. | 710/129 |
| 6,260,154 B1 | 7/2001 | Jeddeloh | 713/401 |
| 6,262,938 B1 | 7/2001 | Lee et al. | 365/233 |
| 6,266,285 B1 | 7/2001 | Farmwald et al. | 365/194 |
| 6,295,572 B1 | 9/2001 | Wu | 710/131 |
| 6,298,426 B1 | 10/2001 | Ajanovic | 711/172 |
| 6,314,051 B1 | 11/2001 | Farmwald et al. | 365/233 |
| 6,324,120 B2 | 11/2001 | Farmwald et al. | 365/233 |
| 6,326,810 B1 | 12/2001 | Keeth | 326/83 |
| 6,327,664 B1 | 12/2001 | Dell et al. | 713/323 |
| 6,330,683 B1 | 12/2001 | Jeddeloh | 713/401 |
| 6,338,108 B1 | 1/2002 | Motomura | |
| 6,338,113 B1 | 1/2002 | Kubo et al. | 711/105 |
| 6,353,561 B1 | 3/2002 | Funyu et al. | 365/195 |
| 6,356,105 B1 | 3/2002 | Volk | 326/30 |
| 6,356,500 B1 | 3/2002 | Cloud et al. | 365/226 |
| 6,362,656 B2 | 3/2002 | Rhee | 326/87 |
| 6,363,031 B2 | 3/2002 | Phelan | 365/233 |
| 6,378,020 B2 | 4/2002 | Farmwald et al. | 710/129 |
| 6,381,188 B1 | 4/2002 | Choi et al. | 365/222 |
| 6,381,668 B1 | 4/2002 | Lunteren | 711/5 |

| | | | |
|---|---|---|---|
| 6,392,304 B1 | 5/2002 | Butler | 257/777 |
| 6,418,034 B1 | 7/2002 | Weber et al. | 361/790 |
| 6,426,916 B2 | 7/2002 | Farmwald et al. | 365/233 |
| 6,430,103 B2 | 8/2002 | Nakayama et al. | |
| 6,437,600 B1 | 8/2002 | Keeth | 326/86 |
| 6,438,057 B1 | 8/2002 | Ruckerbauer | 365/222 |
| 6,442,698 B2 | 8/2002 | Nizar | 713/320 |
| 6,452,826 B1 | 9/2002 | Kim et al. | 365/51 |
| 6,452,863 B2 | 9/2002 | Farmwald et al. | 365/233 |
| 6,453,400 B1 | 9/2002 | Maesako et al. | 711/167 |
| 6,457,095 B1 | 9/2002 | Volk | 711/105 |
| 6,459,651 B1 | 10/2002 | Lee et al. | 365/233 |
| 6,487,102 B1 | 11/2002 | Halbert et al. | 365/51 |
| 6,489,669 B2 | 12/2002 | Shimada et al. | 257/686 |
| 6,493,789 B2 | 12/2002 | Ware et al. | 711/105 |
| 6,496,440 B2 | 12/2002 | Manning | 365/230 |
| 6,496,897 B2 | 12/2002 | Ware et al. | 711/105 |
| 6,510,097 B2 | 1/2003 | Fukuyama | |
| 6,510,503 B2 | 1/2003 | Gillingham et al. | 711/167 |
| 6,521,984 B2 | 2/2003 | Matsuura | 257/768 |
| 6,526,471 B1 | 2/2003 | Shimomura et al. | 711/5 |
| 6,526,484 B1 | 2/2003 | Stacovsky et al. | 711/158 |
| 6,545,895 B1 | 4/2003 | Li et al. | 365/52 |
| 6,546,446 B2 | 4/2003 | Farmwald et al. | 710/305 |
| 6,553,450 B1 | 4/2003 | Dodd et al. | 711/105 |
| 6,560,158 B2 | 5/2003 | Choi et al. | 365/226 |
| 6,563,337 B2 | 5/2003 | Dour | 326/30 |
| 6,563,759 B2 | 5/2003 | Yahata et al. | 365/233 |
| 6,564,281 B2 | 5/2003 | Farmwald et al. | 710/305 |
| 6,574,150 B2 | 6/2003 | Suyama et al. | 365/189 |
| 6,584,037 B2 | 6/2003 | Farmwald et al. | 365/233 |
| 6,587,912 B2 | 7/2003 | Leddige et al. | 711/5 |
| 6,590,822 B2 | 7/2003 | Hwang et al. | 365/222 |
| 6,594,770 B1 | 7/2003 | Sato et al. | 713/320 |
| 6,597,617 B2 | 7/2003 | Ooishi et al. | 365/222 |
| 6,614,700 B2 | 9/2003 | Dietrich et al. | 365/194 |
| 6,618,791 B1 | 9/2003 | Dodd et al. | 711/105 |
| 6,621,760 B1 | 9/2003 | Ahmad et al. | 365/233 |
| 6,630,729 B2 | 10/2003 | Huang | 257/676 |
| 6,631,086 B1* | 10/2003 | Bill et al. | 365/185.09 |
| 6,639,820 B1 | 10/2003 | Khandekar et al. | 365/63 |
| 6,646,939 B2 | 11/2003 | Kwak | 365/219 |
| 6,650,594 B1 | 11/2003 | Lee et al. | 365/233 |
| 6,657,634 B1 | 12/2003 | Sinclair et al. | 345/534 |
| 6,657,918 B2 | 12/2003 | Foss et al. | 365/233 |
| 6,657,919 B2 | 12/2003 | Foss et al. | 365/233 |
| 6,658,530 B1 | 12/2003 | Robertson et al. | 711/115 |
| 6,665,224 B1 | 12/2003 | Lehmann et al. | 365/222 |
| 6,665,227 B2 | 12/2003 | Fetzer | 365/229 |
| 6,683,372 B1 | 1/2004 | Wong et al. | 257/686 |
| 6,697,295 B2 | 2/2004 | Farmwald et al. | 365/233 |
| 6,701,446 B2 | 3/2004 | Tsern et al. | 713/501 |
| 6,705,877 B1 | 3/2004 | Li et al. | 439/74 |
| 6,708,144 B1* | 3/2004 | Merryman et al. | 703/14 |
| 6,714,891 B2* | 3/2004 | Dendinger | 702/132 |
| 6,724,684 B2 | 4/2004 | Kim | 365/233 |
| 6,744,687 B2 | 6/2004 | Koo et al. | 365/226 |
| 6,747,887 B2 | 6/2004 | Halbert et al. | 365/51 |
| 6,751,113 B2 | 6/2004 | Bhakta et al. | 365/63 |
| 6,751,696 B2 | 6/2004 | Farmwald et al. | 710/305 |
| 6,754,129 B2 | 6/2004 | Khatri et al. | 365/226 |
| 6,754,132 B2 | 6/2004 | Kyung | 365/233 |
| 6,757,751 B1 | 6/2004 | Gene | 710/36 |
| 6,762,948 B2 | 7/2004 | Kyun et al. | 365/51 |
| 6,765,812 B2 | 7/2004 | Anderson | 365/51 |
| 6,771,526 B2 | 8/2004 | LaBerge | 365/63 |
| 6,772,359 B2 | 8/2004 | Kwak et al. | 713/500 |
| 6,779,097 B2 | 8/2004 | Gillingham et al. | 711/167 |
| 6,795,899 B2 | 9/2004 | Dodd et al. | 711/137 |
| 6,799,241 B2 | 9/2004 | Kahn et al. | 711/105 |
| 6,807,598 B2 | 10/2004 | Farmwald et al. | 710/305 |
| 6,816,991 B2 | 11/2004 | Sanghani | 714/733 |
| 6,819,602 B2 | 11/2004 | Seo et al. | 365/193 |
| 6,819,617 B2 | 11/2004 | Hwang et al. | 365/222 |
| 6,820,163 B1 | 11/2004 | McCall et al. | 710/310 |
| 6,820,169 B2 | 11/2004 | Wilcox et al. | 711/105 |
| 6,826,104 B2 | 11/2004 | Kawaguchi et al. | 365/222 |
| 6,839,290 B2 | 1/2005 | Ahmad et al. | 365/193 |
| 6,845,055 B1 | 1/2005 | Koga et al. | 365/229 |
| 6,847,582 B2 | 1/2005 | Pan | 365/233 |
| 6,850,449 B2 | 2/2005 | Takahashi | 365/222 |
| 6,862,202 B2 | 3/2005 | Schaefer | 365/52 |
| 6,862,249 B2 | 3/2005 | Kyung | 365/233 |
| 6,862,653 B1 | 3/2005 | Dodd et al. | 711/105 |
| 6,873,534 B2 | 3/2005 | Bhakta et al. | 365/63 |
| 6,878,570 B2 | 4/2005 | Lyu et al. | 438/106 |
| 6,894,933 B2 | 5/2005 | Kuzmenka et al. | 365/189 |
| 6,898,683 B2 | 5/2005 | Nakamura | 711/167 |
| 6,922,371 B2 | 7/2005 | Takahashi et al. | 365/227 |
| 6,930,900 B2 | 8/2005 | Bhakta et al. | 365/51 |
| 6,930,903 B2 | 8/2005 | Bhakta et al. | 365/63 |
| 6,938,119 B2 | 8/2005 | Kohn et al. | 711/105 |
| 6,943,450 B2 | 9/2005 | Fee et al. | 257/773 |
| 6,951,982 B2 | 10/2005 | Chye et al. | 174/52 |
| 6,961,281 B2 | 11/2005 | Wong et al. | 365/230 |
| 6,968,416 B2 | 11/2005 | Moy | 710/310 |
| 6,968,419 B1 | 11/2005 | Holman | 711/5 |
| 6,970,968 B1 | 11/2005 | Holman | 711/5 |
| 6,986,118 B2 | 1/2006 | Dickman | 716/8 |
| 6,992,501 B2 | 1/2006 | Rapport | 326/30 |
| 6,992,950 B2 | 1/2006 | Foss et al. | 365/233 |
| 7,000,062 B2 | 2/2006 | Perego et al. | 711/5 |
| 7,003,618 B2 | 2/2006 | Perego et al. | 711/5 |
| 7,003,639 B2 | 2/2006 | Tsern et al. | 711/154 |
| 7,007,175 B2 | 2/2006 | Chang et al. | 713/300 |
| 7,010,642 B2 | 3/2006 | Perego et al. | 711/5 |
| 7,010,736 B1* | 3/2006 | Teh et al. | 714/733 |
| 7,026,708 B2 | 4/2006 | Cady et al. | 257/686 |
| 7,028,234 B2 | 4/2006 | Huckaby et al. | 714/710 |
| 7,033,861 B1 | 4/2006 | Partridge et al. | 438/109 |
| 7,035,150 B2 | 4/2006 | Streif et al. | 365/194 |
| 7,045,396 B2 | 5/2006 | Crowley et al. | 438/123 |
| 7,045,901 B2 | 5/2006 | Lin et al. | 257/778 |
| 7,046,538 B2 | 5/2006 | Kinsley et al. | 365/52 |
| 7,053,470 B1 | 5/2006 | Sellers et al. | 257/768 |
| 7,053,478 B2 | 5/2006 | Roper et al. | 257/686 |
| 7,061,784 B2 | 6/2006 | Jakobs et al. | 365/51 |
| 7,061,823 B2 | 6/2006 | Faue et al. | 365/230 |
| 7,066,741 B2 | 6/2006 | Burns et al. | 439/69 |
| 7,079,441 B1 | 7/2006 | Partsch et al. | 365/226 |
| 7,079,446 B2 | 7/2006 | Murtagh et al. | 365/233 |
| 7,085,941 B2 | 8/2006 | Li | 713/300 |
| 7,089,438 B2 | 8/2006 | Raad | 713/322 |
| 7,103,730 B2 | 9/2006 | Saxena et al. | 711/156 |
| 7,126,399 B1* | 10/2006 | Lee | 327/261 |
| 7,149,824 B2 | 12/2006 | Johnson | 710/35 |
| 7,205,789 B1 | 4/2007 | Karabatsos | 326/30 |
| 7,228,264 B2 | 6/2007 | Barrenscheen et al. | 703/23 |
| 7,245,541 B2 | 7/2007 | Janzen | 365/198 |
| 7,269,708 B2 | 9/2007 | Ware | 711/203 |
| 7,299,330 B2 | 11/2007 | Gillingham et al. | 711/167 |
| 7,379,316 B2 | 5/2008 | Rajan | 365/63 |
| 7,386,656 B2 | 6/2008 | Rajan et al. | 711/103 |
| 7,392,338 B2 | 6/2008 | Rajan et al. | 711/103 |
| 2001/0000822 A1 | 5/2001 | Dell et al. | 711/170 |
| 2001/0021106 A1 | 9/2001 | Weber et al. | 361/790 |
| 2001/0021137 A1 | 9/2001 | Kai et al. | 365/222 |
| 2002/0019961 A1 | 2/2002 | Blodgett | 714/718 |
| 2002/0034068 A1 | 3/2002 | Weber et al. | 361/790 |
| 2002/0038405 A1 | 3/2002 | Leddige et al. | 711/115 |
| 2002/0041507 A1 | 4/2002 | Woo et al. | 365/51 |
| 2002/0064073 A1 | 5/2002 | Chien | 365/200 |
| 2002/0064083 A1 | 5/2002 | Ryu et al. | 365/233 |
| 2002/0089831 A1 | 7/2002 | Forthun | 361/760 |
| 2002/0124195 A1 | 9/2002 | Nizar | 713/320 |
| 2002/0145900 A1 | 10/2002 | Schaefer | 365/52 |

| Pub. No. | Date | Inventor | Class |
|---|---|---|---|
| 2002/0174274 A1 | 11/2002 | Wu et al. | 710/100 |
| 2002/0184438 A1 | 12/2002 | Usui | 711/106 |
| 2003/0002262 A1 | 1/2003 | Benisek et al. | 361/728 |
| 2003/0021175 A1 | 1/2003 | Kwak | 365/219 |
| 2003/0035312 A1 | 2/2003 | Halbert et al. | 365/51 |
| 2003/0039158 A1 | 2/2003 | Horiguchi et al. | 365/200 |
| 2003/0061458 A1 | 3/2003 | Wilcox et al. | 711/167 |
| 2003/0093614 A1 | 5/2003 | Kohn et al. | 711/105 |
| 2003/0101392 A1 | 5/2003 | Lee | 714/718 |
| 2003/0105932 A1 | 6/2003 | David et al. | 711/167 |
| 2003/0117875 A1 | 6/2003 | Lee et al. | 365/226 |
| 2003/0126338 A1 | 7/2003 | Dodd et al. | 710/305 |
| 2003/0131160 A1 | 7/2003 | Hampel et al. | 710/22 |
| 2003/0158995 A1 | 8/2003 | Lee et al. | 711/105 |
| 2003/0164539 A1 | 9/2003 | Yau | 257/686 |
| 2003/0182513 A1 | 9/2003 | Dodd et al. | 711/137 |
| 2003/0183934 A1 | 10/2003 | Barrett | 257/738 |
| 2003/0189868 A1 | 10/2003 | Riesenman et al. | 365/226 |
| 2003/0189870 A1 | 10/2003 | Wilcox | 365/233 |
| 2003/0191888 A1 | 10/2003 | Klein | 711/105 |
| 2003/0191915 A1 | 10/2003 | Saxena et al. | 711/160 |
| 2003/0200382 A1 | 10/2003 | Wells et al. | 711/106 |
| 2003/0200474 A1 | 10/2003 | Li | 713/300 |
| 2003/0205802 A1 | 11/2003 | Segaram | 257/690 |
| 2003/0206476 A1 | 11/2003 | Joo | 365/222 |
| 2003/0217303 A1 | 11/2003 | Chua-Eoan et al. | 713/600 |
| 2003/0227798 A1 | 12/2003 | Pax | 365/189 |
| 2003/0229821 A1 | 12/2003 | Ma | 714/8 |
| 2003/0231540 A1 | 12/2003 | Lazar et al. | 365/222 |
| 2003/0231542 A1 | 12/2003 | Zaharinova-Papazova et al. | 365/226 |
| 2004/0027902 A1 | 2/2004 | Ooishi et al. | 365/222 |
| 2004/0034732 A1 | 2/2004 | Valin et al. | 714/4 |
| 2004/0044808 A1 | 3/2004 | Salmon et al. | 710/8 |
| 2004/0047228 A1 | 3/2004 | Chen | 365/232 |
| 2004/0057317 A1 | 3/2004 | Schaefer | 365/222 |
| 2004/0064767 A1 | 4/2004 | Huckaby et al. | 714/767 |
| 2004/0088475 A1 | 5/2004 | Streif et al. | 711/105 |
| 2004/0117723 A1 | 6/2004 | Foss | 714/805 |
| 2004/0125635 A1 | 7/2004 | Kuzmenka | 365/51 |
| 2004/0133736 A1 | 7/2004 | Kyung | 711/105 |
| 2004/0139359 A1 | 7/2004 | Samson et al. | 713/320 |
| 2004/0145963 A1 | 7/2004 | Byon | 365/233 |
| 2004/0151038 A1 | 8/2004 | Ruckerbauer et al. | 365/200 |
| 2004/0174765 A1 | 9/2004 | Seo et al. | 365/233 |
| 2004/0178824 A1 | 9/2004 | Pan | 326/93 |
| 2004/0184324 A1 | 9/2004 | Pax | 365/189 |
| 2004/0186956 A1 | 9/2004 | Perego et al. | 711/115 |
| 2004/0188704 A1 | 9/2004 | Halbert et al. | 257/145 |
| 2004/0196732 A1 | 10/2004 | Lee | 365/233 |
| 2004/0228166 A1 | 11/2004 | Braun et al. | 365/154 |
| 2004/0228203 A1 | 11/2004 | Koo | 365/233 |
| 2004/0230932 A1 | 11/2004 | Dickmann | 716/10 |
| 2004/0256638 A1 | 12/2004 | Perego et al. | 257/200 |
| 2004/0257847 A1 | 12/2004 | Matsui et al. | 365/63 |
| 2004/0260957 A1 | 12/2004 | Jeddeloh et al. | 713/300 |
| 2004/0264255 A1 | 12/2004 | Royer | 365/189.01 |
| 2004/0268161 A1 | 12/2004 | Ross | 713/300 |
| 2005/0018495 A1 | 1/2005 | Bhakta et al. | 365/199 |
| 2005/0021874 A1 | 1/2005 | Georgiou et al. | 709/250 |
| 2005/0024963 A1 | 2/2005 | Jakobs et al. | 365/202 |
| 2005/0028038 A1 | 2/2005 | Pomaranski et al. | 714/42 |
| 2005/0036350 A1 | 2/2005 | So et al. | 365/63 |
| 2005/0041504 A1 | 2/2005 | Perego et al. | 365/222 |
| 2005/0044303 A1 | 2/2005 | Perego et al. | 711/5 |
| 2005/0044305 A1 | 2/2005 | Jakobs et al. | 711/105 |
| 2005/0047192 A1 | 3/2005 | Matsui et al. | 365/145 |
| 2005/0071543 A1 | 3/2005 | Ellis et al. | 711/106 |
| 2005/0078532 A1 | 4/2005 | Ruckerbauer et al. | 365/199 |
| 2005/0081085 A1 | 4/2005 | Ellis et al. | 714/5 |
| 2005/0099834 A1 | 5/2005 | Funaba et al. | 365/63 |
| 2005/0102590 A1 | 5/2005 | Norris et al. | 714/719 |
| 2005/0105318 A1 | 5/2005 | Funaba et al. | 365/63 |
| 2005/0138267 A1 | 6/2005 | Bains et al. | 711/100 |
| 2005/0139977 A1 | 6/2005 | Nishio et al. | |
| 2005/0141199 A1 | 6/2005 | Chiou et al. | 361/704 |
| 2005/0149662 A1 | 7/2005 | Perego | 711/5 |
| 2005/0152212 A1 | 7/2005 | Yang et al. | 365/233 |
| 2005/0156934 A1 | 7/2005 | Perego et al. | 345/531 |
| 2005/0166026 A1 | 7/2005 | Ware et al. | 711/167 |
| 2005/0193163 A1 | 9/2005 | Perego | 711/105 |
| 2005/0194991 A1 | 9/2005 | Dour et al. | 326/30 |
| 2005/0195629 A1 | 9/2005 | Leddige et al. | 365/51 |
| 2005/0204111 A1 | 9/2005 | Natarajan | 711/167 |
| 2005/0207255 A1 | 9/2005 | Perego et al. | 365/222 |
| 2005/0210196 A1 | 9/2005 | Perego et al. | 711/115 |
| 2005/0223179 A1 | 10/2005 | Perego et al. | 711/154 |
| 2005/0224948 A1 | 10/2005 | Lee et al. | 257/686 |
| 2005/0235131 A1 | 10/2005 | Ware | 711/203 |
| 2005/0249011 A1 | 11/2005 | Maeda | 365/222 |
| 2005/0259504 A1 | 11/2005 | Murtugh et al. | 365/233 |
| 2005/0265506 A1 | 12/2005 | Foss et al. | 375/376 |
| 2005/0269715 A1 | 12/2005 | Yoo | 257/780 |
| 2005/0278474 A1 | 12/2005 | Perersen et al. | 711/5 |
| 2005/0281123 A1 | 12/2005 | Bell et al. | 365/230 |
| 2005/0283572 A1 | 12/2005 | Ishihara | 711/118 |
| 2005/0285174 A1 | 12/2005 | Saito et al. | 257/296 |
| 2005/0289292 A1 | 12/2005 | Morrow et al. | 711/105 |
| 2006/0010339 A1 | 1/2006 | Klein | 714/5 |
| 2006/0039205 A1 | 2/2006 | Cornelius | 365/189 |
| 2006/0041711 A1 | 2/2006 | Miura et al. | 711/103 |
| 2006/0041730 A1 | 2/2006 | Larson | 711/167 |
| 2006/0044913 A1 | 3/2006 | Klein et al. | 365/222 |
| 2006/0049502 A1 | 3/2006 | Goodwin et al. | 257/686 |
| 2006/0050574 A1 | 3/2006 | Streif et al. | 365/194 |
| 2006/0067141 A1 | 3/2006 | Perego et al. | 365/200 |
| 2006/0085616 A1 | 4/2006 | Zeighami et al. | 711/167 |
| 2006/0090054 A1 | 4/2006 | Choi et al. | 711/167 |
| 2006/0112214 A1 | 5/2006 | Yeh | 711/103 |
| 2006/0117160 A1 | 6/2006 | Jackson et al. | 711/170 |
| 2006/0118933 A1 | 6/2006 | Haba | 257/678 |
| 2006/0120193 A1 | 6/2006 | Casper | 365/222 |
| 2006/0123265 A1 | 6/2006 | Ruckerbauer et al. | 713/500 |
| 2006/0126369 A1 | 6/2006 | Raghuram | 365/51 |
| 2006/0129712 A1 | 6/2006 | Raghuram | 710/52 |
| 2006/0129755 A1 | 6/2006 | Raghuram | 711/105 |
| 2006/0133173 A1 | 6/2006 | Jain et al. | 365/222 |
| 2006/0149982 A1 | 7/2006 | Vogt | 713/320 |
| 2006/0176744 A1 | 8/2006 | Stave | 365/194 |
| 2006/0179333 A1 | 8/2006 | Brittain et al. | 713/320 |
| 2006/0179334 A1 | 8/2006 | Brittain et al. | 713/320 |
| 2006/0198178 A1 | 9/2006 | Kinsley et al. | 365/52 |
| 2006/0203590 A1 | 9/2006 | Mori et al. | 365/222 |
| 2006/0206738 A1 | 9/2006 | Jeddeloh et al. | 713/320 |
| 2006/0233012 A1 | 10/2006 | Sekiguchi et al. | 365/51 |
| 2006/0262586 A1 | 11/2006 | Solomon et al. | 365/63 |
| 2007/0070669 A1 | 3/2007 | Tsern et al. | |
| 2007/0088995 A1 | 4/2007 | Tsern et al. | |
| 2008/0065820 A1 | 3/2008 | Gillingham et al. | 711/105 |

FOREIGN PATENT DOCUMENTS

| | | |
|---|---|---|
| DE | 102005036528 | 2/2007 |
| GB | 2441726 | 3/2008 |
| JP | 01171047 | 7/1989 |
| JP | 03-029357 | 2/1991 |
| JP | 03/276487 | 12/1991 |
| JP | 03286234 | 12/1991 |
| JP | 07-141870 | 6/1995 |
| JP | 08/077097 | 3/1996 |
| JP | 08077097 | 3/1996 |
| JP | 11-149775 | 6/1999 |
| JP | 2002025255 | 1/2002 |
| KR | 1020040062717 | 7/2004 |
| WO | WO9505676 | 2/1995 |
| WO | WO9900734 | 1/1999 |

| | | |
|---|---|---|
| WO | WO2007002324 A2 * | 1/2007 |
| WO | WO 2007/038225 A2 | 4/2007 |

OTHER PUBLICATIONS

International Search Report for Related Foreign Application PCT/US2006/024360.

International Search Report for related foreign application PCT/US06/34390.

Written Opinion of the International Searching Authority for related foreign application PCT/US06/34390.

Kellerbauer "Die Schnelle Million," with translation, "The quick million," 2004.

Wu et al., "eNVy: A Non-Volatile, Main Memory Storage System," to appear in ASPLOS VI, 1993.

"Using Two Chip Selects to Enable Quad Rank," IP.com PriorArtDatabase. copyright IP.com, Inc. 2004.

"BIOS and Kernel Developer's Guide (BKDG) for AMD Family 10h Processors," AMD, 31116 Rev 3.00, Sep. 7, 2007.

Skerlj et al., "Buffer Device For Memory Modules (DIMM)" Qimonda 2006, p. 1.

Written Opinion from PCT Application No. PCT/US06/24360 mailed on Jan. 8, 2007.

Preliminary Report On Patentability from PCT Application No. PCT/US06/24360 mailed on Jan. 10, 2008.

Written Opinion from International PCT Application No. PCT/US06/34390 mailed on Nov. 21, 2007.

International Search Report from PCT Application No. PCT/US06/34390 mailed on Nov. 21, 2007.

* cited by examiner

INTEGRATED MEMORY CORE AND MEMORY INTERFACE CIRCUIT

RELATED APPLICATIONS

This patent application claims the benefit to U.S. Provisional Patent Application entitled "Methods and Apparatus for Integrating Multi-Chip Memory Devices," Ser. No. 60/693,631, filed on Jun. 24, 2005.

BACKGROUND OF THE INVENTION

1. Field of the Invention

The present invention is directed toward the field of building custom memory systems cost-effectively for a wide range of markets.

2. Art Background

Dynamic Random Access Memory (DRAM) is the most popular type of volatile memory and is widely used in a number of different markets. The popularity of DRAMs is mostly due to their cost-effectiveness (Mb/$). The PC main memory market has traditionally been the largest consumer of DRAMs. However, in recent times, other important markets have adopted DRAMs. A report published by De Dios and Associates showed that in 2004, the PC main memory market consumed only 50% of the total DRAM bits.

Several of the non-PC markets use specialty or legacy memories. Specialty memory is typically memory that is not used by the PC main memory but is memory that is designed for one or more niche markets. For example, the PC graphics market uses GDDR (Graphics Dual Data Rate) DRAM. Similarly, some segments of the network infrastructure market use FCRAM (Fast Cycle RAM) or RLDRAM (Reduced Latency DRAM). Legacy memory is typically memory that was used in the past but is not used in that particular market segment now. For example, SDRAM (Synchronous DRAM) was used for PC main memory from ~1997 to ~2001 but is no longer used today for PC main memory. Instead, most cellular phones and handheld (or mobile) devices use SDRAM today.

Bringing a new DRAM architecture into the market requires significant investment of time and money. For example, it typically takes 4 years for JEDEC to approve a new DRAM architecture. DRAM makers must then spend hundreds of millions of dollars to productize the new architecture. Unless the investment is amortized over an extremely large number of devices, the cost of the new devices will be high. In addition, the DRAM makers have optimized their manufacturing flow for high volumes. Any deviation from the norm disrupts the flow. This is the reason why specialty and legacy memory typically carry a price premium over memory used by the PC main memory market (which is usually referred to as commodity memory).

Given the time and money required to bring a new DRAM architecture into the market, it is obvious that the industry does not have the luxury of being able to define a DRAM architecture that exclusively meets the needs of the smaller markets for DRAMs. For example, it is difficult for the DRAM makers to cost-effectively produce a DRAM that perfectly meets the needs of the cell phone market. Therefore, it is even more difficult for each cell phone maker (e.g. Nokia or Motorola) to design DRAMs tailor made for its phones. So, cell phone designers are forced to choose the DRAM architecture that is least objectionable from their perspective. Hence the selection of SDRAM for cell phones.

This situation will become even worse in the future. Most analyst projections show that not only will DRAM usage expand rapidly into newer markets but also that the DRAM bit consumption growth rate will be higher for non-PC markets. The needs of these markets are quite different from the needs of the PC main memory market. Clearly, there is a need in the market for a way to quickly and cost-effectively build custom memory that is tailor made for a customer's exact needs.

SUMMARY OF THE INVENTION

A memory device comprises a first integrated circuit die. The first integrated circuit die comprises a memory core, with a plurality of memory cells, and a first interface circuit for accessing the memory cells of the memory core. For example, the first interface circuit provides reading, writing, activating, pre-charging and refreshing operations to the memory cells. A second integrated circuit die, electrically coupled to the first integrated circuit die, comprises a second interface circuit for accessing the memory core via the first interface circuit and for interfacing the memory core to an external circuit. For example, the second interface circuit may comprise a synchronous interface to an external bus. As such, the memory device has two separate die: one for the memory core and a second as an external interface.

In one embodiment, the memory core includes a plurality of memory banks for partitioning the memory cells. A multiplexer, coupled to the memory banks, selects data from one or more of the memory banks. The multiplexer is located generally near an edge of the first integrated circuit die. The first integrated circuit die further comprises data input/output ("I/O") pads and a plurality of bond wires that couple the multiplexer to the I/O pads. The I/O pads are located essentially adjacent to the multiplexer near an edge of the first integrated circuit die so as to minimize distance of the bond wires.

In another embodiment, a distributed-bank architecture is used to configure the memory device. For this embodiment, the memory cells are partitioned into memory banks. The memory banks comprise a plurality of sub-arrays across the physical sections of the memory core such that a physical section of the memory cells comprises a plurality of sub-arrays associated with different memory banks. A multiplexer selects a memory bank from a physical section.

In some embodiment, the first and second integrated circuit dies are housed in separate packages. In other embodiments, the first and second integrated circuit dies are housed in the same package.

DETAILED DESCRIPTION

Figure 1:
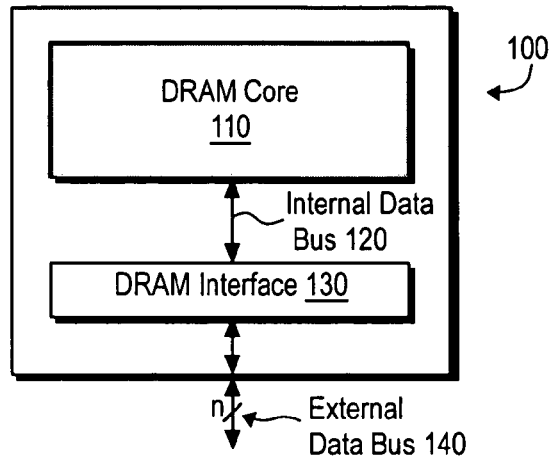
FIG. 1 is a block diagram illustrating a conventional DRAM chip.

The disclosure of U.S. Provisional Patent Application Ser. No. 60/693,631, entitled "Methods and Apparatus for Integrating Multi-Chip Memory Devices", filed on Jun. 24, 2005, is hereby expressly incorporated herein by reference.

By examining several different DRAM architectures, it is clear that the internal organizations of the DRAMs are quite similar. For example, a ×16 (×16 denotes the external data width) 256 Mb SDRAM, ×16 256 Mb DDR SDRAM, and ×16 256 Mb DDR2 SDRAM consist of:

Control logic block;
Address input register and decoder;
Memory arrays that store the data;
Data selection circuit (I/O gating);
Data read circuit; and
Data write circuit.

It is obvious that most of the blocks are common across all the three architectures. The main differences are in the control logic block (which implements the protocol, among other functions), in the width of the data that is accessed per column address, and in the data I/O section. These are usually considered part of the interface section of the DRAM while the rest of the circuits (address decoder, memory arrays, and data selection) are considered part of the memory core. The core timing parameters are typically specified in absolute units of time (seconds) rather than in terms of clock periods. For example, the Micron 256 Mb DDR2 SDRAM data sheet lists the following core timing parameters:

TABLE 1

| Speed Grade | $t_{RCD}$ (ns) | $t_{RP}$ (ns) | $t_{RC}$ (ns) |
|---|---|---|---|
| −5E | 15 | 15 | 55 |
| −37E | 15 | 15 | 55 |
| −3 | 15 | 15 | 55 |
| −3E | 12 | 12 | 54 |

Similarly, the Micron 256 Mb DDR SDRAM data sheet identifies the following timing specifications:

TABLE 2

| Speed Grade | $t_{RCD}$ (ns) | $t_{RP}$ (ns) | $t_{RC}$ (ns) |
|---|---|---|---|
| −75Z | 20 | 20 | 65 |
| −75 | 20 | 20 | 65 |

The Micron 256 Mb SDRAM data sheet discloses the following specifications:

TABLE 3

| Speed Grade | $t_{RCD}$ (ns) | $t_{RP}$ (ns) | $t_{RC}$ (ns) |
|---|---|---|---|
| −7E | 15 | 15 | 60 |
| −75 | 20 | 20 | 66 |

So, even though the protocol and speed of SDRAM, DDR SDRAM, and DDR2 SDRAM are quite different, it is clear that the internal core or array of all these types of DRAMs has similar characteristics. In fact, we can go even further and observe that all synchronous DRAMs are composed of an asynchronous core and an interface that defines the protocol, synchronous operation, speed, and signaling. The memory core typically comprises ~90%-95% of the total die area.

Current practice is to integrate the memory core and the interface onto a common die. The drawback with this approach is that a change in the protocol, speed, or signaling for example requires a re-design of the entire chip. This is usually very expensive and time consuming, and hence the inability to bring specialty or custom DRAMs to the market quickly and cost-effectively. One embodiment of the invention comprises a multi-chip implementation, wherein one or more DRAM core chips are attached to an interface chip. The interface chip sits between the host electronic system and the DRAM core chips. In other words, the interface chip can be thought of as a "wrapper" that surrounds the DRAM core chips. The partitioning of the conventional DRAM into DRAM core chip and interface chip should preferably be done is such a way that that the functions and circuits that are relatively constant across many different architectures are retained in the DRAM core chip while the functions and circuits that vary between the different architectures are moved to the interface chip.

The DRAM core chip can be designed to be suitable for a large number of markets (i.e. a "universal core"). The interface chip can now be designed to meet the exact needs of a market, and even the exact needs of individual customers in that market. To illustrate, the proposed solution enables the design of an interface chip to meet the exact needs of Nokia for the cell phone market and another interface chip to meet the exact needs of Motorola for the cell phone market.

In order to accommodate the needs of the different markets, the DRAM core chip must be capable of operating across a wide range of frequencies, be capable of supporting high data rates, and must be low cost. In one embodiment, the DRAM core chip is asynchronous, wide, and operates at its natural speed. For the case of modern DRAM cores, the natural speed is between 5 ns to 10 ns per column access, which is equivalent to 100 MHz to 200 MHz synchronous operation. That is, a modern DRAM core can keep up with an external memory bus or interface that runs at a speed from 100 MHz to 200 MHz. So, for the case of a synchronous DRAM that operates at 100 MHz to 200 MHz and is n-bits wide ($1 \leq n \leq 32$ typically), n bits can be fetched from the DRAM core once every clock cycle. In fact, this is how SDRAMs operate.

Newer synchronous DRAMs run at higher clock speeds. JEDEC defines the DDR SDRAM specification with external data rates of 200 MHz, 266 MHz, 333 MHz, and 400 MHz. An even newer specification called DDR2 SDRAM has been defined with external data rates of 400 MHz, 533 MHz, 667 MHz, and 800 MHz. Effort is currently underway in JEDEC to define a DDR3 SDRAM specification that spans data rates from 800 MHz to 1600 MHz. GDDR, GDDR2, and GDDR3 SDRAMs typically run faster than the DDR, DDR2, and DDR3 SDRAMs. However, even though the external data rate has been increasing quite rapidly, the speed of the DRAM core has not kept pace. In order to bridge the gap between the external data rate and the internal core speed, the DRAM industry has adopted a technique called "pre-fetching."

Pre-fetching involves accessing more bits than the external data bus width on every column access. To illustrate, an n-bit wide DDR SDRAM accesses 2n bits every column access. This allows the external data bus to run at 200 MHz to 400 MHz while the internal memory core runs at 100 MHz to 200 MHz respectively. FIG. 1 is a block diagram illustrating a conventional DRAM chip. A DRAM chip 100 comprises a DRAM core 110, Internal Data Bus 120, DRAM interface 130 and External data bus 140. TABLE 4 shows the concept of pre-fetching for a DRAM chip.

TABLE 4

| Protocol | External Data Bus 140 Width | Internal Data Bus 120 Width | External Data Rate (MHz) | Internal Data Rate (MHz) |
|---|---|---|---|---|
| SDRAM | N | n | 66-133 | 66-133 |
| DDR SDRAM | N | 2n | 200-400 | 100-200 |
| DDR2 SDRAM | n | 4n | 400-800 | 100-200 |
| DDR3 SDRAM (proposed) | n | 8n | 800-1600 | 100-200 |

This implies that the universal DRAM core chip must be sufficiently wide enough to support the data rates required by many different markets. Obviously there is a limit to how wide the universal DRAM core chip can be before it starts to negatively impact the cost of the chip. In general, if the width of the DRAM core chip is so large so as to make either the core chip or the interface chip pad limited (especially the core chip), the cost of this solution would be very high.

Modern DRAMs also feature multiple banks. A bank is a section of the DRAM core that can be accessed independently. The DRAM core is broken up into banks that can be active simultaneously. Within each bank, only one row can be open at any given time. Most DRAMs up to 512 Mb densities are organized into 4 banks. 1 Gb (and possibly, up to 4 Gb) DRAMs are organized into 8 banks but only 4 banks can be activated within a specific time window. This is dictated by power and thermal considerations. So, the universal DRAM core chip must be capable of supporting multiple banks.

Let us consider the internal organization of a ×16 256 Mb SDRAM. A ×16 256 Mb SDRAM may have 4 banks, each of which is 64 Mb. Each bank can be conceptualized as consisting of 16 sub-arrays, each sub-array being a 8192×512 matrix of memory cells. That is, each sub-array has 8192 or 8 k rows and 512 columns. So, when a bank is accessed, a particular row is accessed (activated) in each of the 16 sub-arrays in the bank. The row is determined by the row address. After the 16 rows are activated, a particular bit in each row is selected. The bit is specified by the column address. So, on each access to a bank, 16 bits are accessed.

Figure 2:
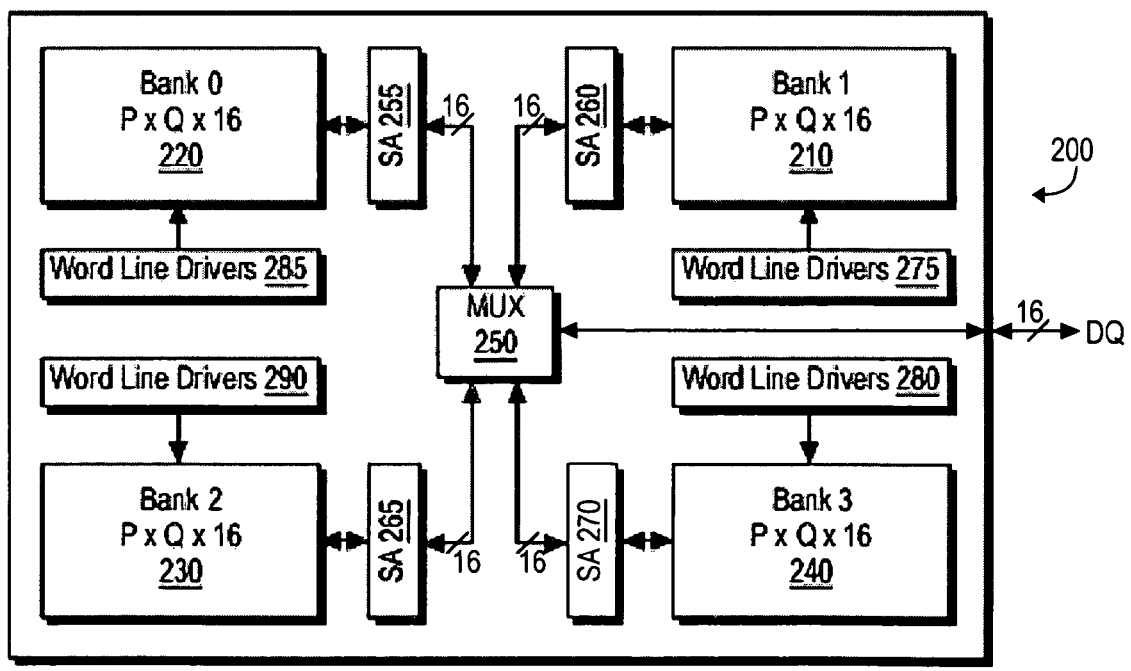
FIG. 2 illustrates a typical organization of a 4-bank modern SDRAM.

FIG. 2 illustrates a typical organization of a 4-bank modern SDRAM. The memory cells are arranged into four banks: bank 0 (220), bank 1 (210), bank 2 (230) and bank 3 (240). Each bank contains P×Q×16 cells (e.g., P=8192 and Q=512 for a 256 Mb SDRAM). Each bank has associated word line drivers (275, 280, 285 and 290) and sense amplifiers (255, 260, 265 and 270). The banks are selected through use of MUX 250.

Figure 3:
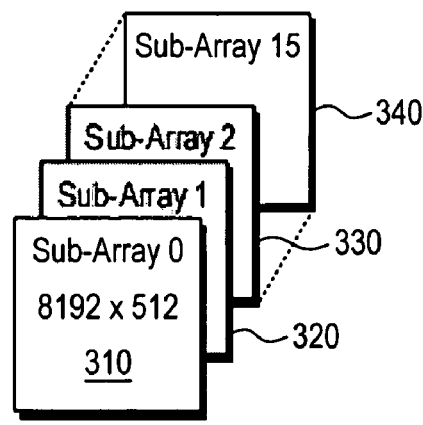
FIG. 3 is a block diagram illustrating one embodiment of banks arranged in sub-arrays.

In one embodiment, the banks are organized in sub-arrays. FIG. 3 is a block diagram illustrating one embodiment of banks arranged in sub-arrays. For this embodiment, each bank has 16 sub-arrays (each sub-array being 8K×512) because the DRAM is organized as a ×16 memory.

Consider the internal organization of a ×16 256 Mb DDR SDRAM. The ×16 256 Mb DDR SDRAM is organized similar to the ×16 256 Mb SDRAM with some changes to the memory core. The more important changes to the core organization are:

Each bank has 32 sub-arrays; and

Each sub-array is now 8192×256 matrix (i.e. P=8192, Q=256). The reason for having 32 sub-arrays is that DDR SDRAM memory uses a pre-fetching of 2n. Since this is a ×16 DDR memory, 32 bits must be accessed from each bank for a read or write operation.

Note that pre-fetching can be done in a number of ways. Consider a memory array that is organized as a P×Q matrix that needs to support 2n pre-fetching. One approach is to divide the P×Q array into two arrays (i.e. two P×Q/2 arrays) and access both arrays in parallel, so that we get 2 bits per column address. Another approach is to not split the array but modify the column decoder so that 2 bits are selected for each column address (in other words, the least significant bit of the column address is not used). Some embodiments of the invention are described that use the first approach. However, the teachings of the present invention are applicable to different pre-fetching implementations.

Looking at the organization of a ×16 256 Mb DDR2 SDRAM, the ×16 256 Mb DDR2 SDRAM is organized similar to the ×16 256 Mb SDRAM (and the ×16 256 Mb DDR SDRAM). The following identify some of the changes to the memory core:

Each bank has 64 sub-arrays. Each sub-array is now a 8192×128 matrix (i.e. P=8192, Q=128). The reason for the 64 sub-arrays per bank is that DDR2 SDRAM uses a 4n pre-fetching. Since this is a ×16 DDR2 memory (n=16), 64 bits must be accessed from each bank for a read or write operation.

Figure 4:
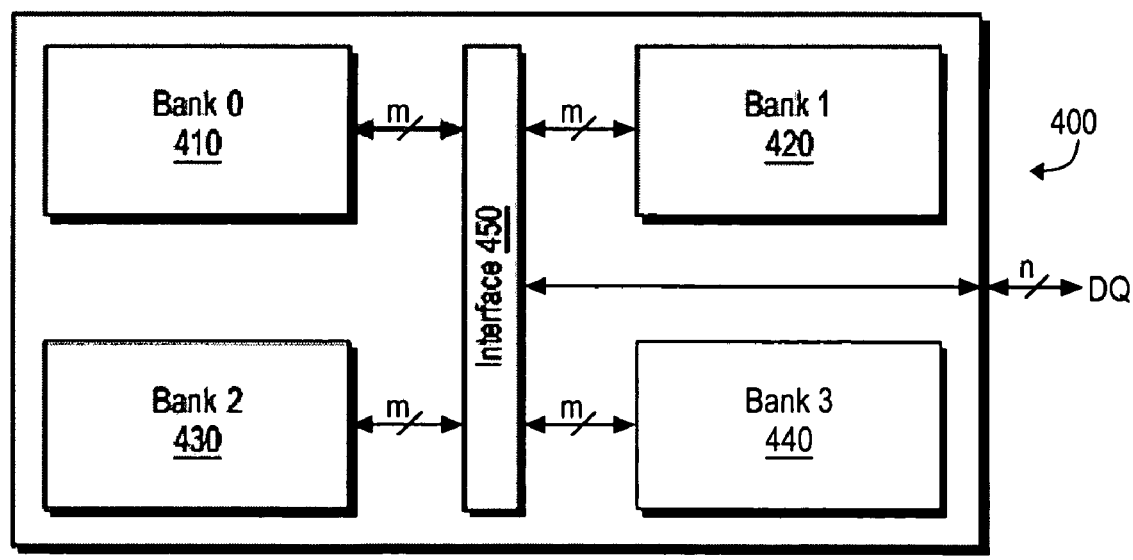
FIG. 4 illustrates a block diagram of an interface and multiple banks in a DRAM.

In all cases (SDRAM, DDR, DDR2), data bits to/from each bank are brought to a multiplexer/de-multiplexer (hereafter referred to as a MUX), which in turn is connected to the external DQ pins. This MUX is typically in the middle of the DRAM chip. FIG. 4 illustrates a block diagram of an interface and multiple banks in a DRAM. As shown in FIG. 4, bank 0 (410), bank 1 (420), bank 2 (430) and bank 3 (440) are accessed by interface 450. Note that for SDRAM, m=n, for DDR SDRAM, m=2n, DDR2 SDRAM, m=4n, and DDR3 SDRAM (proposed), m=8n, Also note that the data MUX is typically part of the interface.

Figure 5:
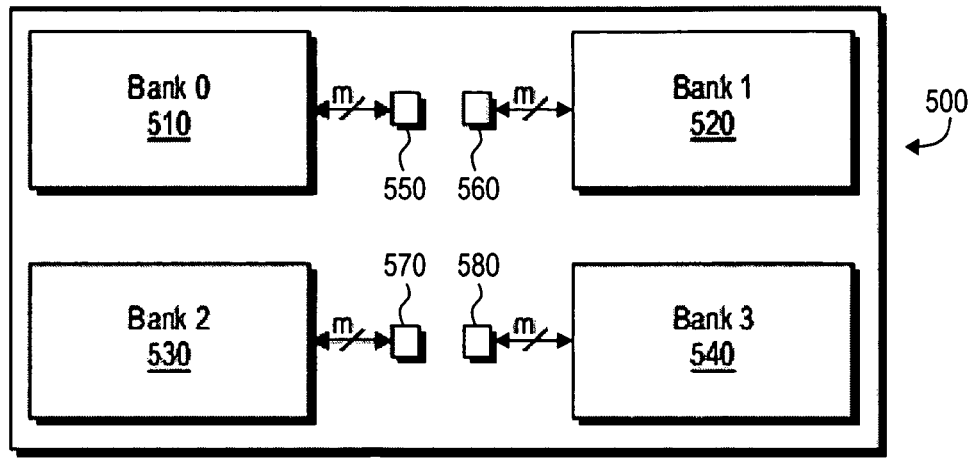
FIG. 5 is a block diagram illustrating a DRAM chip with an interface removed.

This arrangement works well for a conventional DRAM since everything is on a single die. However, in one embodiment of the invention, the interface is on a separate die. If we were to just move the interface alone (to another die) without disturbing the memory core, then the number of I/O pads on both the memory core chip and the interface chip will become quite large, as shown in TABLE 5 below for a ×16 4-bank implementation. FIG. 5 is a block diagram illustrating a DRAM chip with an interface removed. For this embodiment, bank 0 (510), bank 1 (520), bank 2 (530) and bank 3 (540) are coupled to I/O pads 550, 560, 570 and 580, respectively. If we look at only the data pins and ignored the address, command, power and ground pins, we can see that the number of data signals that have to go off-chip between the DRAM core chip and the interface chip is 4m.

TABLE 5

| Protocol | External Data Bus Width (n) | m | Total Number of Off-Chip Data Pins (4 m) |
|---|---|---|---|
| SDRAM | 16 | 16 | 64 |
| DDR SDRAM | 16 | 32 | 128 |
| DDR2 SDRAM | 16 | 64 | 256 |
| DDR3 SDRAM | 16 | 128 | 512 |

So, it is quite obvious that removing the interface without disturbing the rest of the memory core quickly leads to a very large number of off-chip connections, especially for wider external data bus widths and higher data speeds (because, the amount of pre-fetching will increase with higher data speeds). Under these conditions, either the DRAM core chip or the interface chip or both will become pad limited, which will increase the cost of the total solution.

In one embodiment, in order to reduce the number of off-chip connections between the DRAM core chip and the interface chip, some part or all of the multiplexing of the data I/O from the banks is done in the core chip itself.

Figure 6:
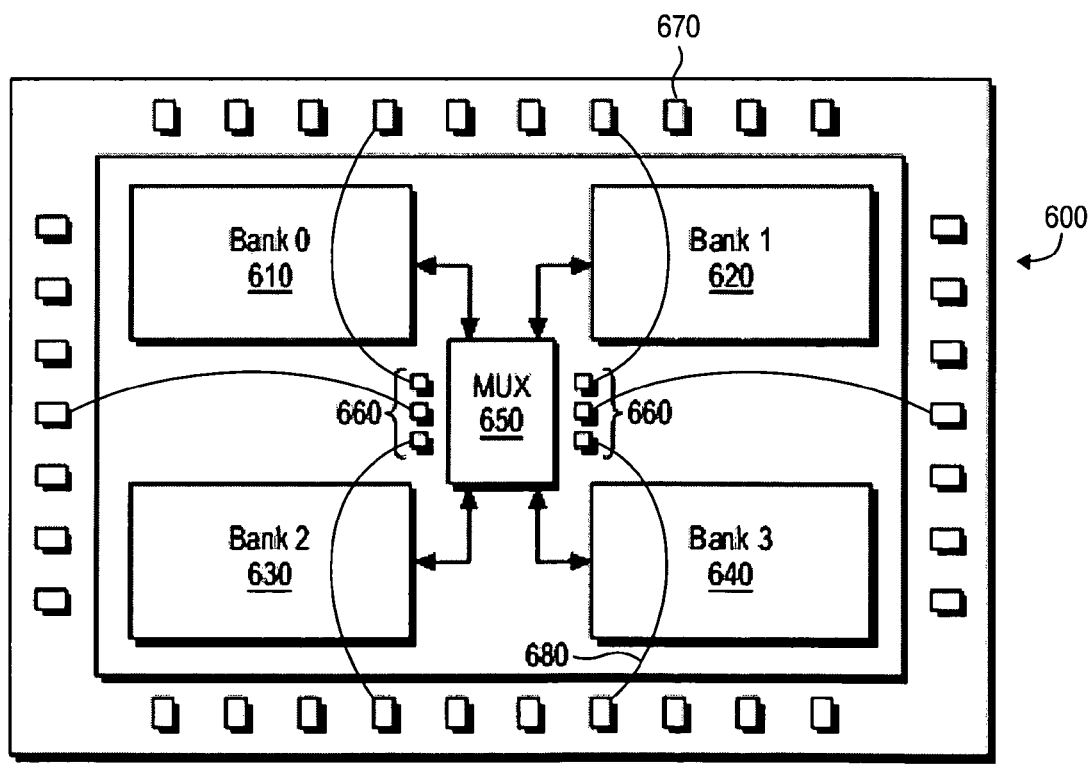
FIG. 6 illustrates one embodiment for a center bonded DRAM core chip.

One option is to route all the data bits from each bank to a central MUX, and then connect the other side of the MUX to off-chip drivers. This is quite similar to the current practice for center bonded DRAMs. FIG. 6 illustrates one embodiment for a center bonded DRAM core chip. For this example, integrated circuit 600 includes bank 0 (610), bank 1 (620), bank 2 (630) and bank 3 (640) coupled to MUX 650. MUX 650 is connected to substrate bonding pads 670 via bond wires 680 through I/O pads 660.

The drawback with this approach is that bond wires 680 that connect I/O pads 660 on the DRAM core die to the substrate bonding pads 670 become quite long. Long bond wires have significant inductance and limit the speed at which the memory chip can operate.

Figure 7:
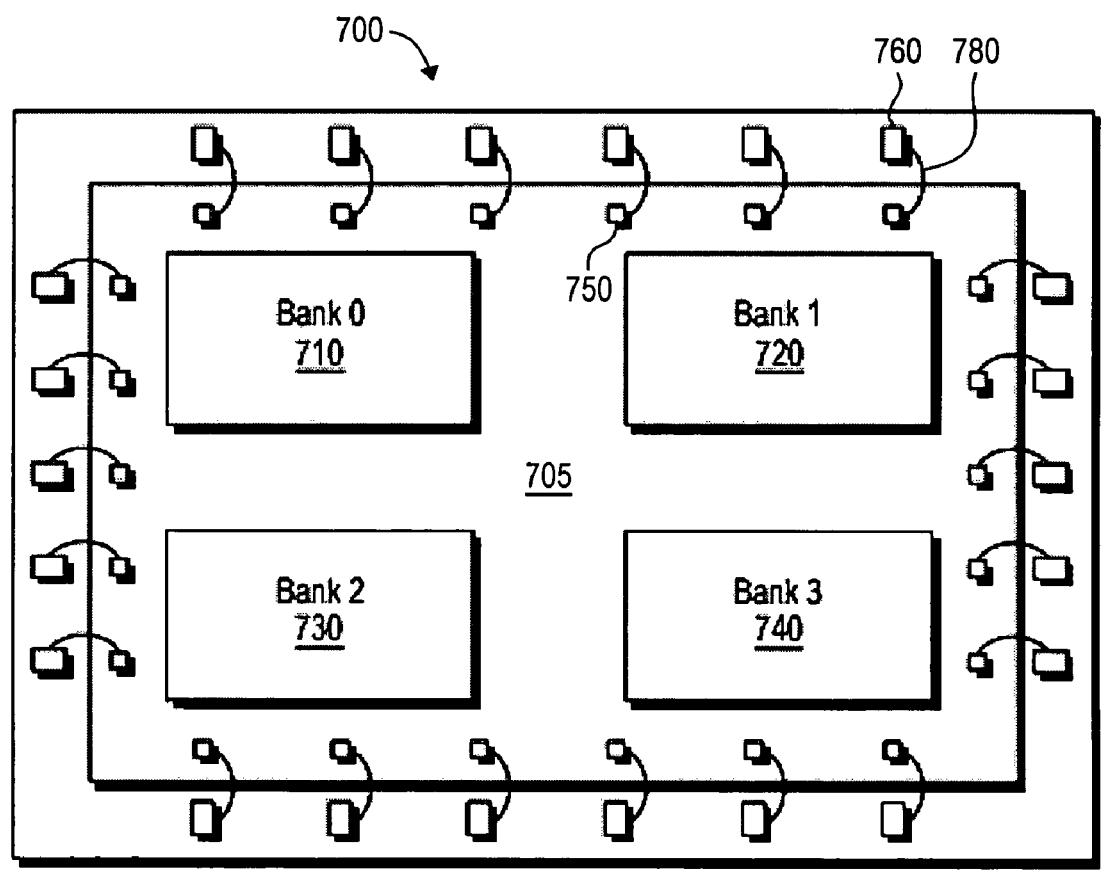
FIG. 7 illustrates one embodiment for an edge bonded DRAM core chip.

In another embodiment, edge bonding for the core chip is used. FIG. 7 illustrates one embodiment for an edge bonded DRAM core chip. For this embodiment, integrated circuit 700 includes bank 0 (710), bank 1 (720), bank 2 (730) and bank 3 (740). I/O pads 750, located on the silicon die 705, are connected to the substrate bonding pads 760 via bond wires 780.

If the DRAM core was organized with one bank per quadrant, then the number of data I/O pads will be equal to 4m as illustrated previously. The other option is to route the data bits from each bank to a centrally located MUX (as shown in FIG. 6) and then route the signals from the other side of the MUX to the periphery of the die. However, this means that the data signals will have to traverse the die twice—once from the bank to the central MUX and once from the central MUX to the periphery. This increases routing complexity, may possibly require an extra metal layer on the die (higher cost), and adds to the latency of the memory core.

In another embodiment, an inventive "Distributed-Bank" architecture is used. In this architecture, a bank is distributed (or spread) across all 4 quadrants instead of concentrating a bank in only one quadrant. Using this architecture, data MUXs, located in all 4 quadrants, select the appropriate bank, and the data signals corresponding to the selected bank can be easily routed to the periphery of the chip.

Figure 8:
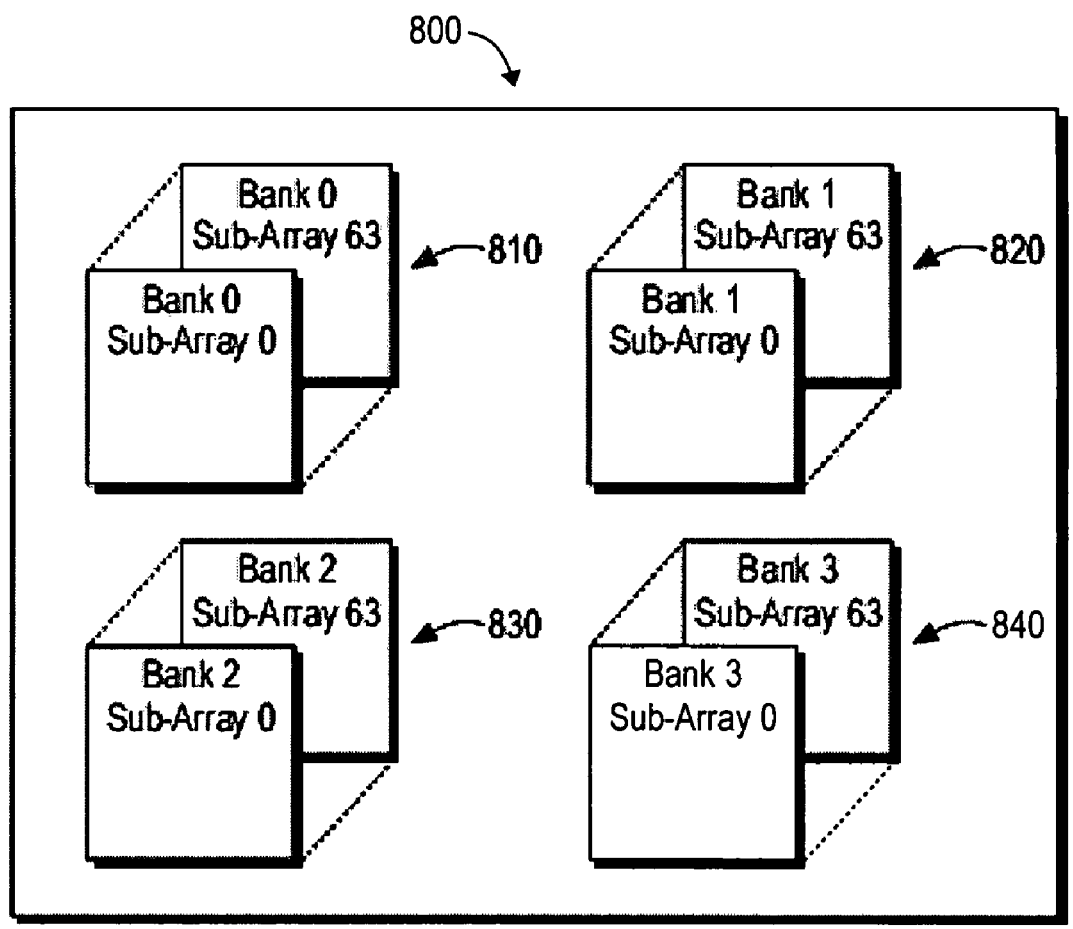
FIG. 8 illustrates one embodiment for a concentrated-bank architecture.

FIG. 8 illustrates one embodiment for a concentrated-bank architecture. For the purpose of this illustration, a ×16, 4-bank, 256 Mb DDR2 SDRAM core is used. However, any type of DRAM, with different external data widths, different number of banks, different density, and different amount of pre-fetching may be used without deviating from the spirit or scope of the invention. As previously shown, each bank (810, 820, 830 and 840) in a ×16, 4-bank, 256 Mb DDR2 SDRAM consists of 64 sub-arrays, with each sub-array organized as a 8192×128 array of memory cells.

Figure 9:
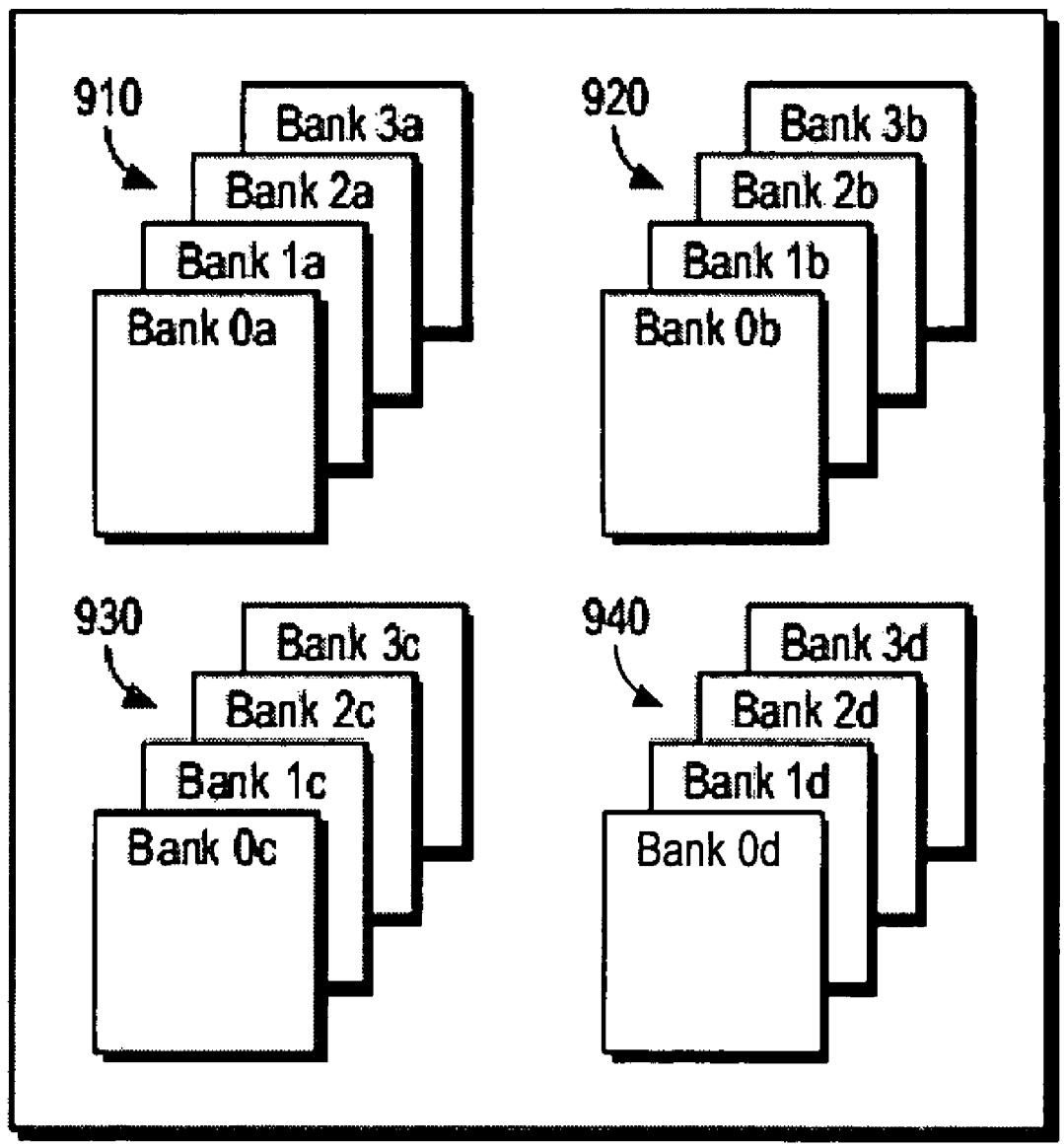
FIG. 9 illustrates one embodiment for a distributed-bank architecture.

FIG. 9 illustrates one embodiment for a distributed-bank architecture. For this embodiment, the DRAM core chip is divided into four quadrants (910, 920, 930 and 940). Each quadrant includes a portion of a bank.

Figure 10:
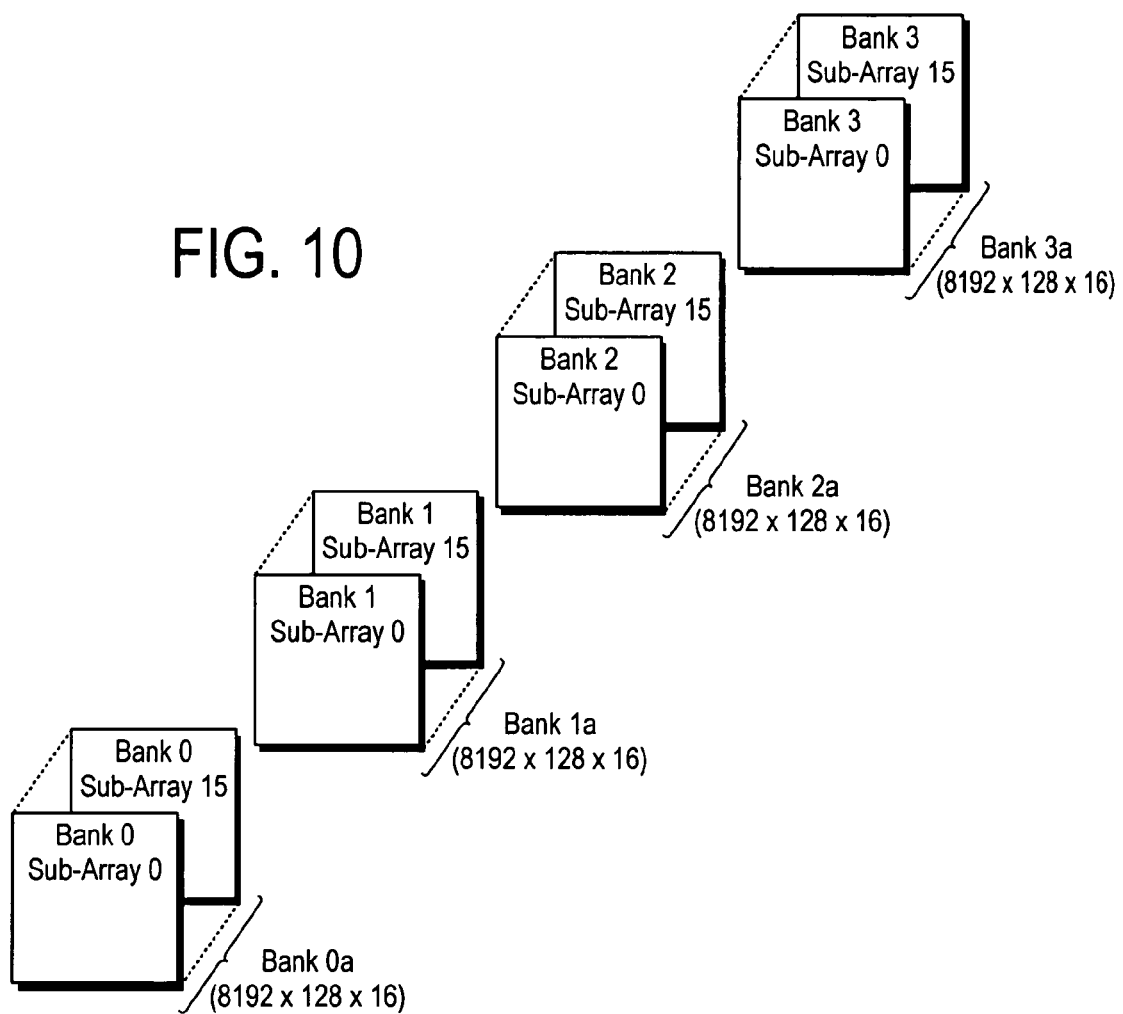
FIG. 10 illustrates one embodiment for a quadrant in a distributed-bank architecture DRAM core chip.

FIG. 10 illustrates one embodiment for a quadrant in a distributed-bank architecture DRAM core chip. As discussed previously, there are 64 sub-arrays per quadrant with each sub-array being a 8192×128 matrix. Instead of assigning all 64 sub-arrays in a single quadrant to a single bank in the concentrated-bank architecture, there are 16 sub-arrays to each of the 4 banks within a single quadrant in the distributed-bank architecture. In the distributed-bank architecture embodiment, local data MUXs are located in each quadrant to select one of the four banks.

Figure 11:
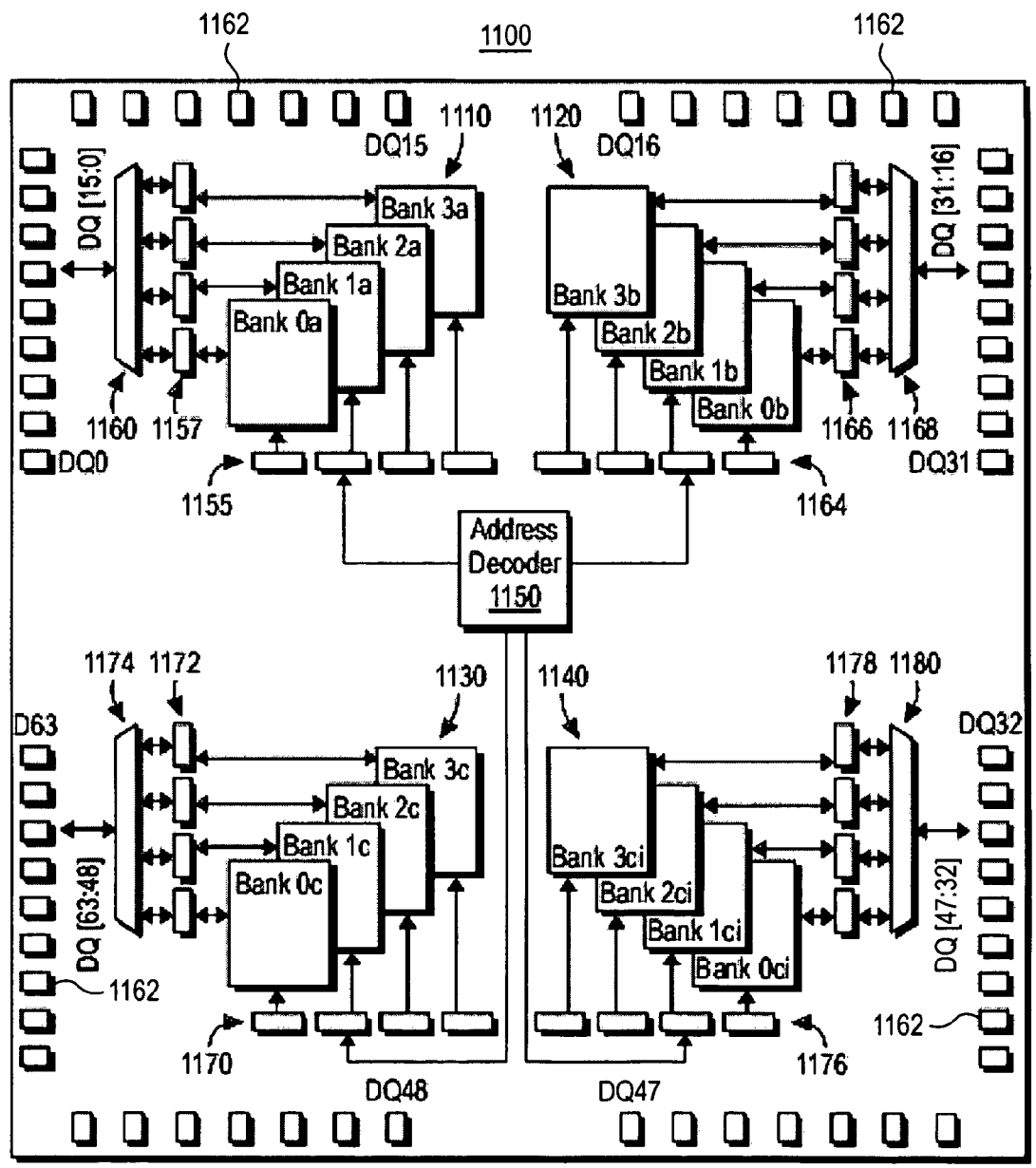
FIG. 11 is block diagram illustrating one embodiment of a distributed-bank architecture universal DRAM core chip.

FIG. 11 is block diagram illustrating one embodiment of a distributed-bank architecture universal DRAM core chip. For this embodiment, the banks of DRAM cells are distributed among quadrant 1110, 1120, 1130 and 1140. An address decoder 1150, located in the center of the chip, controls word line drivers 1155, 1164, 1170 and 1176 in quadrants 1110, 1120, 1130 and 1140 respectively. The data from the bank sub-arrays are output to sense amplifiers (1157, 1166, 1172 and 1178) and input to the respective bank select MUXs (1160, 1168, 1174 and 1180). The data is then routed to data I/O pads 1162 located in the proximity for each of the quadrants.

Since 64 data bits are accessed from the core chip for every read or write operation, the interface chip may be designed or configured to act similar to a ×16 DDR2 SDRAM, ×8 DDR2 SDRAM, ×4 DDR2 SDRAM, ×2 DDR2 SDRAM, or ×1 DDR2 SDRAM. In fact, the interface chip may be designed to support any data width between ×1 and ×16 when operating in a 4n pre-fetch mode.

Figure 12:
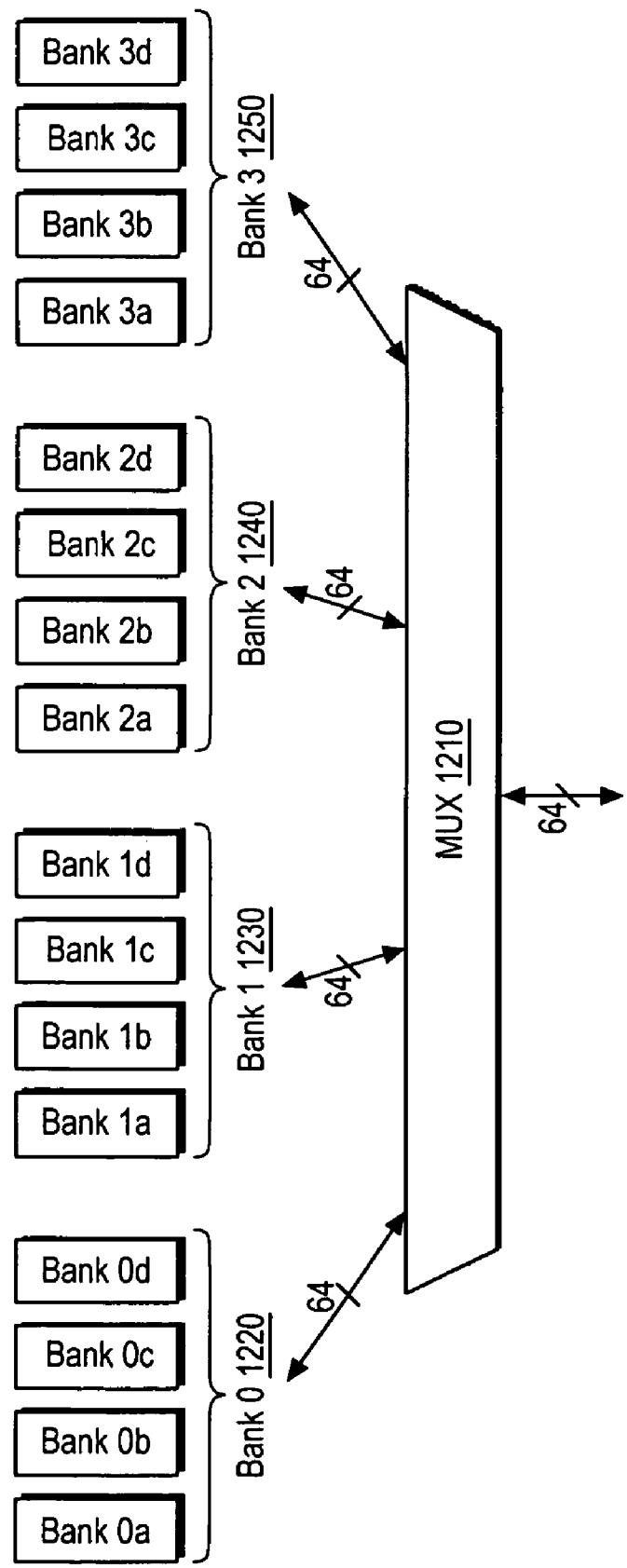
FIG. 12 is a block diagram illustrating a distributed-bank architecture DRAM core chip configured to support DDR2 speeds.

The distributed-bank architecture is flexible enough to support protocols like SDRAM, DDR SDRAM, DDR2 SDRAM, and DDR3 SDRAM. For example, the DRAM core chip shown in FIG. 11 may be configured or used as shown in FIG. 12 to support DDR2 speeds. FIG. 12 is a block diagram illustrating a distributed-bank architecture DRAM core chip configured to support DDR2 speeds. MUX 1210 selects 64 bits of data for one of the banks (1220, 1230, 1240 and 1250). MUX 1210 represents the data MUXs located in all four quadrants on the DRAM core chip.

Figure 13:
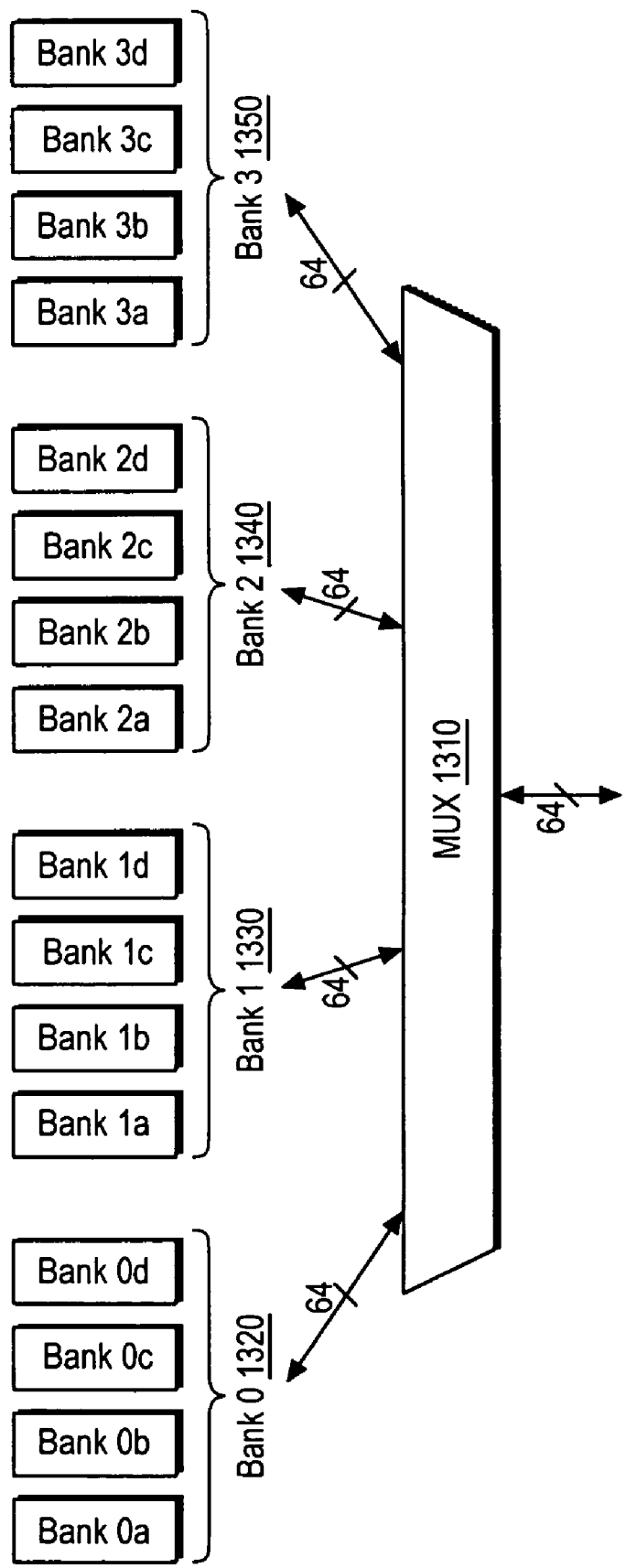
FIG. 13 is a block diagram illustrating a distributed-bank architecture DRAM core chip configured to support DDR speeds and external bus widths from 17 to 32 bits.
Figure 14:
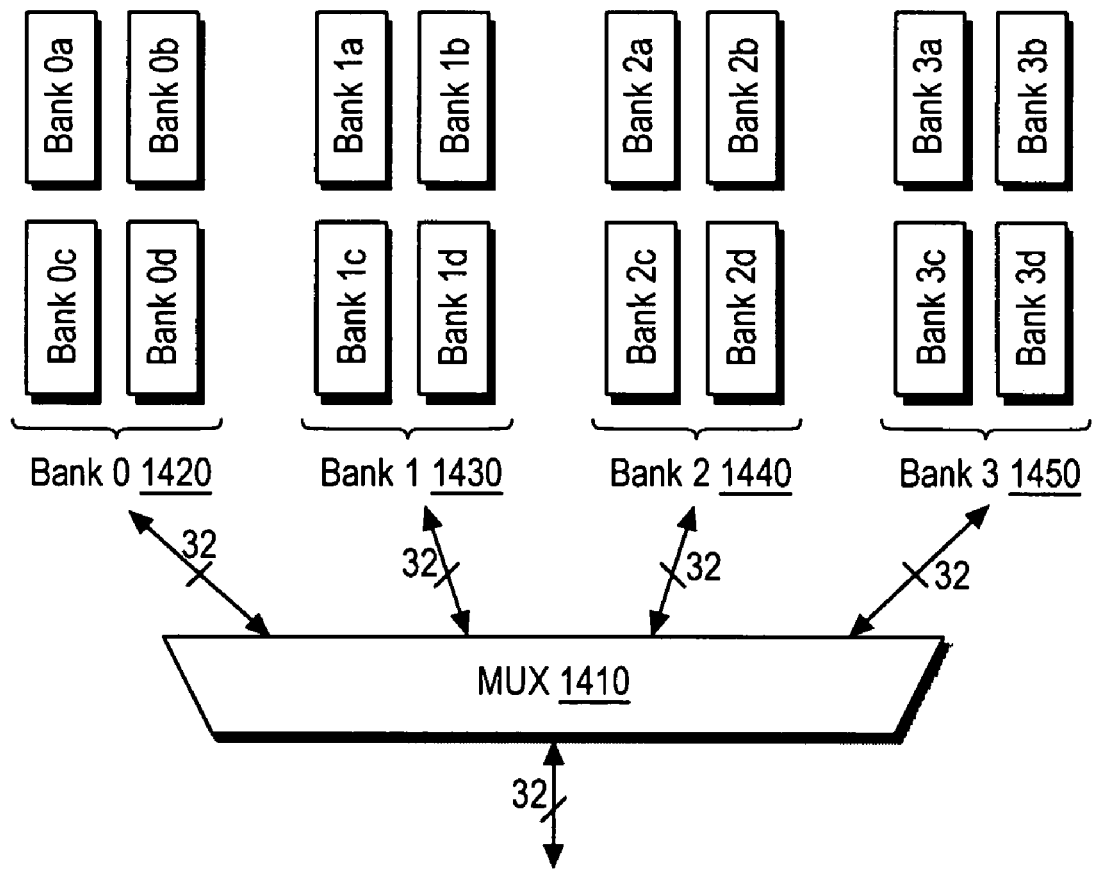
FIG. 14 is a block diagram illustrating a distributed-bank architecture DRAM core chip configured to support DDR speeds and external bus widths from 9 to 16 bits.

The DRAM core chip shown in FIG. 11 may also be configured or used as shown in FIG. 13 to support DDR SDRAM speeds when it is operated in a 2n pre-fetch mode. FIG. 13 is a block diagram illustrating a distributed-bank architecture DRAM core chip configured to support DDR speeds and external bus widths from 17 to 32 bits. MUX 1310 selects 64 bits of data for one of the banks (1320, 1330, 1340 and 1350). The mode of operation shown in FIG. 13 may be used with the appropriate interface chip to support external data widths between (and inclusive) of 17 and 32 in a 2n pre-fetch mode. The same DRAM core chip may be used with the appropriate interface chip to support external data widths between (and inclusive) 9 and 16 in a 2n pre-fetch mode when operated as shown in FIG. 14. FIG. 14 is a block diagram illustrating a distributed-bank architecture DRAM core chip configured to support DDR speeds and external bus widths from 9 to 16 bits. For this embodiment, MUX 1410 selects 32 bits of data for one of the banks (1420, 1430, 1440 and 1450).

Figure 15:
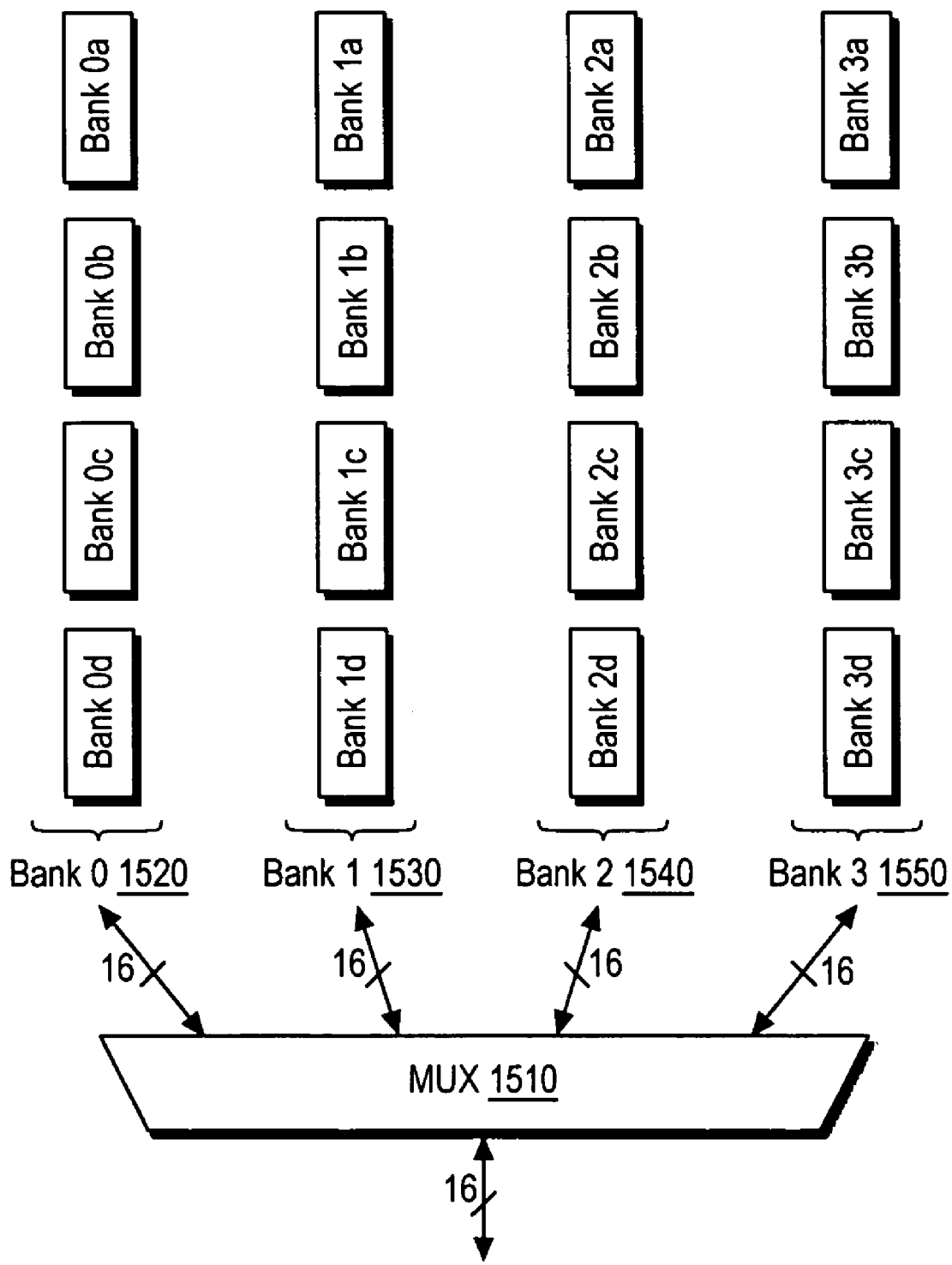
FIG. 15 is a block diagram illustrating a distributed-bank architecture DRAM core chip configured to support DDR speeds and external bus widths from 1 to 8 bits.

Also, the same DRAM core chip can be used with the appropriate interface chip to support external data widths between (and inclusive of) 1 and 8 in a 2n pre-fetch mode. FIG. 15 is a block diagram illustrating a distributed-bank architecture DRAM core chip configured to support DDR speeds and external bus widths from 1 to 8 bits. For this embodiment, MUX 1510 selects 16 bits of data for one of the banks (1520, 1530, 1540 and 1550).

From these architectures, the internal data bus width (the width of the bus between the DRAM core chip and the interface chip) may be configured to match the amount of pre-fetching required (which is determined by the external data rate) and the width of the external data bus. The external data bus is the bus from the interface chip to the ASIC or memory controller. The DRAM core chip as shown in FIG. 11 may be configured to support the following modes and requirements shown in TABLE 6.

TABLE 6

| Internal Data Bus Width | Pre-Fetching Used | Minimum External Data Bus Width | Maximum External Data Bus Width |
|---|---|---|---|
| 64 | 8n | 1 | 8 |
|  | 4n | 1 | 16 |
|  | 2n | 1 | 32 |
|  | 1n | 1 | 64 |
| 32 | 8n | 1 | 4 |
|  | 4n | 1 | 8 |
|  | 2n | 1 | 16 |
|  | 1n | 1 | 32 |

TABLE 6-continued

| Internal Data Bus Width | Pre-Fetching Used | Minimum External Data Bus Width | Maximum External Data Bus Width |
|---|---|---|---|
| 16 | 8n | 1 | 2 |
|  | 4n | 1 | 4 |
|  | 2n | 1 | 8 |
|  | 1n | 1 | 16 |

Note that:

The proposed DDR3 SDRAM is an example of an 8n pre-fetch protocol;

DDR2 SDRAM is an example of a 4n pre-fetch protocol;

DDR SDRAM is an example of a 2n pre-fetch protocol; and

SDRAM is an example of a 1n pre-fetch protocol (i.e. no pre-fetching needed).

Again, for the DRAM core chip shown in FIG. 11, 3 modes of operation may be defined and a 2-bit binary code may be assigned to represent them as shown in TABLE 7.

TABLE 7

| Mode of Operation (Mode[1:0]) | Internal Data Bus Width |
|---|---|
| 00 | 64 |
| 01 | 32 |
| 10 | 16 |
| 11 | Undefined/Reserved |

These two bits (Mode[1:0]) may be inputs to the DRAM core chip so that the internal data bus width is selected through external means. For example, the Mode[1:0] inputs to the core chip may be selected by means of fuses on the core chip or on the interface chip, by means of pull-up or pull-down resistors in the package of either chip (or in the common package) or on the printed circuit board, or may be driven by a register on the interface chip, or may be part of the address input to the core chip.

Figure 16:
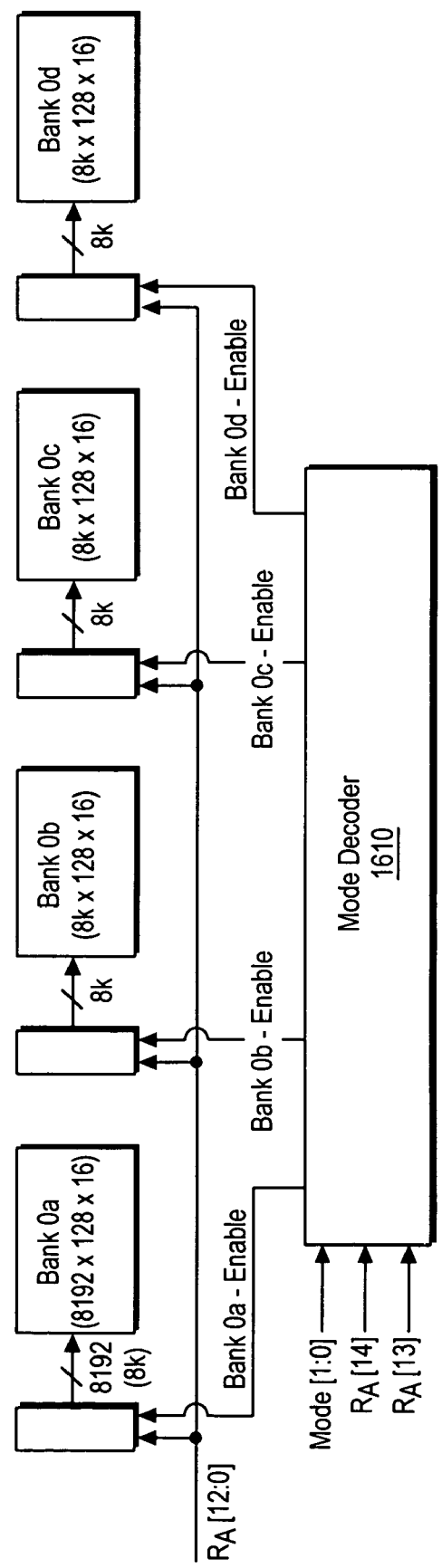
FIG. 16 illustrates one embodiment for a portion of a DRAM core chip that includes a decoder for selecting a mode of operation.

Let us assume that the Mode[1:0] inputs to the DRAM core chip are controlled by a register in the interface chip. FIG. 16 illustrates one embodiment for a portion of a DRAM core chip that includes a decoder for selecting a mode of operation. The decoder 1610 in the core chip is aware of the Mode[1:0] inputs as shown in FIG. 16.

Note that the embodiments disclosed below are based on the DRAM core chip shown in FIG. 11 only for the purpose of explaining the concept, and that the following embodiments are applicable to DRAM core chips of different densities, number of banks, internal organization, and number of sub-arrays. For the purpose of simplicity, only bank 0 is shown being accessed in the different modes of operation.

The mode decoder truth table is shown below in TABLE 8. In TABLE 8 below,

RA=Row Address
X=Don't Care
H=Asserted
L=Not Asserted

TABLE 8

| Mode[1:0] | RA[14] | RA[13] | Bank0a_En | Bank0b_En | Bank0c_En | Bank0d_En |
|---|---|---|---|---|---|---|
| 00 | X | X | H | H | H | H |
| 01 | X | L | H | H | L | L |
|  | X | H | L | L | H | H |

TABLE 8-continued

| Mode[1:0] | RA[14] | RA[13] | Bank0a_En | Bank0b_En | Bank0c_En | Bank0d_En |
|---|---|---|---|---|---|---|
| 10 | L | L | H | L | L | L |
|  | L | H | L | H | L | L |
|  | H | L | L | L | H | L |
|  | H | H | L | L | L | H |

Based on the techniques of the present invention, a universal DRAM core chip, such as the embodiment shown in FIG. 11, may be configured to support a wide variety of data speeds and widths. For example, the core chip shown in FIG. 11 may support data rates up to 8*f MB/s, where f is the maximum clock rate (in MHz) at which the DRAM core can run in sync with the external data bus without using pre-fetching (i.e. using a pre-fetching of 1n ). For modern DRAM processes and designs, f is typically between 100 MHz and 200 MHz. So, the DRAM core chip shown in FIG. 11 supports maximum data rates between 800 MB/s and 1600 MB/s (1.6 GB/s).

In order to build custom memory cost-effectively, it is imperative that the DRAM core chip be used in a variety of markets. This will reduce the cost of the core chip because of economies of scale. Since the memory core is typically 90% to 95% of the silicon area, the overall cost may be lowered. Here, we can make two observations:

Some markets for the universal DRAM core chip value low power at the expense of performance (e.g. cell phones and other handheld devices) whereas other markets will sacrifice power to achieve higher speed (e.g. PC graphics and game console markets).

Semiconductor fabrication process is inherently statistical in nature. That is, if we fabricate a statistically significant number of identical chips, some of the chips will only be capable of operating below the target speed, some of the chip will be capable of operating at the target speed, and some of the chips will be capable of operating above the target speed. These are known in the industry as slow, typical, and fast parts respectively. Usually, the fast parts are sold at a price premium over the other parts while the slow parts are sold at lower prices compared to the typical parts.

However, slow parts typically consume less power than the typical parts, which in turn typically consume less power than the fast parts. So, if we can sort the DRAM core chips according to their maximum speeds of operation (usually called "speed binning") before they are attached to the interface chips, we can:

Attach interface chips designed for low power markets (e.g. an SDRAM-like interface for the cell phone market) to the slow core parts;

Attach interface chips designed for the high performance/speed markets (e.g. a GDDR3-like interface for the game console market) to the fast core parts; and Attach interface chips designed for markets sensitive to both power and performance (e.g. a DDR-like interface for the server market) to the typical core parts.

This allows us to maximize the ASP (average selling price or average sales price) of all the solutions since all the core chips have natural homes.

Speed binning of memory chips is typically done after it is packaged. Note that it is possible to do a simple speed sort of the memory chips at the wafer level itself. In order to do a speed sort or speed bin, we need to use ATE (automatic test equipment), also known as tester.

When we speed bin the DRAM core chips, we need to measure the time required for basic operations like Read, Write, Activate (open one or more pages), Precharge (close one or more pages), and Refresh. To satisfy this requirement, the DRAM core chips, defined by the present invention, are fully functional asynchronous DRAM chips capable of stand-alone operation. In other words, the DRAM core chips contain all the necessary circuits and capabilities needed to access the internal array used to store the data.

Memory makers, especially DRAM manufacturers, build redundancy into the memory core. For example, if the memory array is to be organized as P×Q (P rows and Q columns), the actual array is designed as (P+i)×(Q+j), where i and j are small compared to P and Q respectively. This allows the memory makers to replace up to i defective rows in the main array with the redundant rows, and up to j defective columns in the main array with the redundant columns. With the help of the redundant rows and columns, memory makers can increase the yield (i.e. the percentage of fully functional chips) to $\geq$90%. In a typical DRAM manufacturing flow, the individual dies on a wafer are tested at low speed and the partially functional dies (i.e. those with some defective rows and/or columns) are marked. The defective rows and/or columns on these marked dies are replaced with the redundant rows and/or columns respectively.

However, a die that uses the redundant rows and/or columns (because it had some defective rows and/or columns) will be slower than a die that does not use redundant rows and/or columns. This is due to the nature of how redundancy is built into the memory and how it is enabled. Therefore:

Interface chips that are designed for high performance markets may be attached to the DRAM core dies that do not have any defective rows and/or columns in the main array.

In another embodiment, the defective rows and/or columns of memory core dies are not replaced with the redundant rows and/or columns, but are configured to operate the memory core dies as (P/y)×(Q/z), where y and z are preferably powers of 2 (including $2^0$=1). These DRAM core chips may then be attached to interface chips that are designed for high performance markets.

As we have seen previously, the DRAM makers use pre-fetching to support higher external data rates. For example, DDR2 SDRAM uses 4n pre-fetching. This means that for an n-bit wide external data bus, 4n data bits are accessed from the memory core for every read or write. In a conventional DRAM (where the memory core and the interface are on the same die), increasing the amount of pre-fetching increases the amount of metal interconnects on the die, which has a modest impact on the cost. In the invention described herein, increasing the amount of pre-fetching may make either the memory core chip or the interface chip or both pad limited. Being pad limited can increase the cost substantially.

Burst mode is another technique that can be used to increase the data rate of memory chips. In burst mode, the memory chip reads or writes multiple data bits per column address. For example, an n-bit wide (external data bus width) memory chip that is configured for a burst mode of 4n will access 4n bits from the memory core for a given column address. So this is quite similar to a 4n pre-fetch except that in burst mode, the same data wires are used. In other words, in a memory chip that supports 4n burst mode (but not 4n pre-fetching), the internal data bus between the memory core and the interface is only n-bits wide. Each line in the internal bus carries 4 data bits that are separated in time.

Figure 17A:
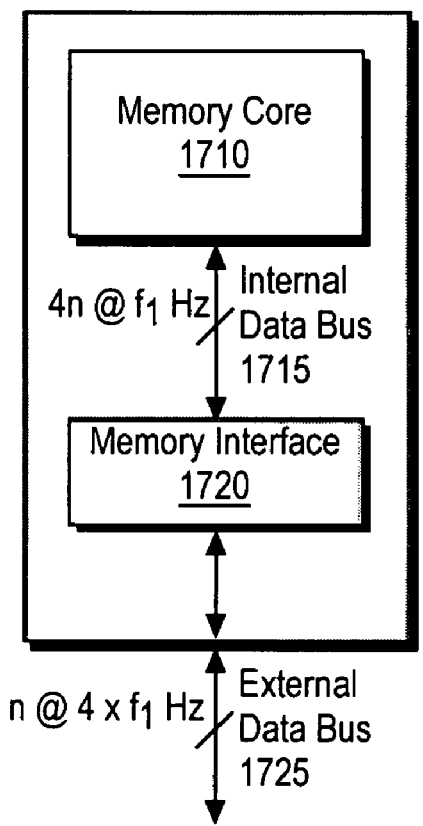
FIG. 17a is a block diagram illustrating the relationship between the internal data bus rate and the external data bus rate for 4n pre-fetching.
Figure 17B:
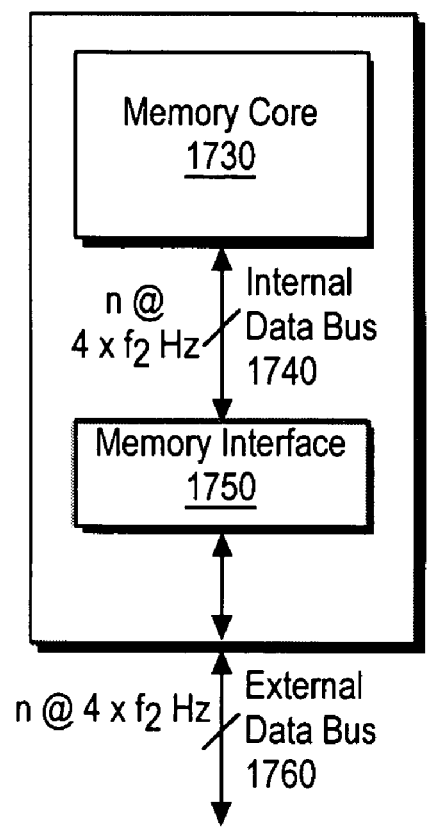
FIG. 17b is a block diagram illustrating the relationship between the internal data bus rate and the external data bus rate for burst mode with a length of 4n.

The difference between pre-fetching and burst mode is shown in FIGS. 17a and 17b. FIG. 17a is a block diagram illustrating the relationship between the internal data bus rate and the external data bus rate for 4n pre-fetching. Memory core 1710 is coupled to memory interface 1720 via internal data bus 1715 at 4n @ $f_1$, Hz data rate. The memory interface 1720 is coupled to external data bus 1725, and under these conditions, the external data bus operates at a n @ $4*f_2$, Hz data rate. FIG. 17b is a block diagram illustrating the relationship between the internal data bus rate and the external data bus rate for burst mode with a length of 4n. Memory core 1730 is coupled to memory interface 1750 via internal data bus 1740 at n @ $4*f_2$, Hz data rate. The memory interface 1750 is coupled to external data bus 1760, and for the burst mode of operation, the external data bus operates at a n @ $4*f_2$, Hz data rate.

Typically, pre-fetching will provide higher external data rates than burst mode. However, burst mode does not increase the amount of off-chip connections between the core chip and the interface chip. So, in some embodiments, it is preferable to design the DRAM core chip of this invention with burst mode capability.

As mentioned previously, one of the aspects of this invention is the ability to test and speed bin the memory core chips and then attach the appropriate interface chips. Testing and speed binning of the DRAM core chip is usually done on a tester. This requires the core chip to have sufficiently strong output drivers to drive the inputs of the tester, which are usually some distance (several inches) from the outputs of the core chip. However, in the normal mode of operation, the inputs of the interface chip will be much closer (<1") to the outputs of the core chip. So, it is not necessary to have strong output drivers in the core chip in the normal mode of operation. In order to satisfy both requirements, in some embodiments the DRAM core chip preferably has output drivers whose strength or drive capability is adjustable. For example, the core chip may have, by default, normal strength output drivers that are capable of driving signals across some distance to the inputs of the tester. However, when an interface chip is attached to the core chip, a signal from the interface chip decreases the drive strength of the core chip's output drivers.

In some embodiments, the output drivers of interface chip that interface with the DRAM core chip have similar adjustable drive strength capability. This allows testing of the interface chips separately prior to attaching them to the core chips. Note that the adjustable drive strength drivers are not necessarily required on the interface chip on the pins that interface to the electronic host system. However, it is preferable to have the adjustable strength capability on these drivers as well so that the drive strength can be tailored to the requirements of the system or external world. As with the DRAM core chips, the strength of the output drivers on the interface chip that communicate with the core chip are preferably controlled by a signal from the core chip.

Figure 18:
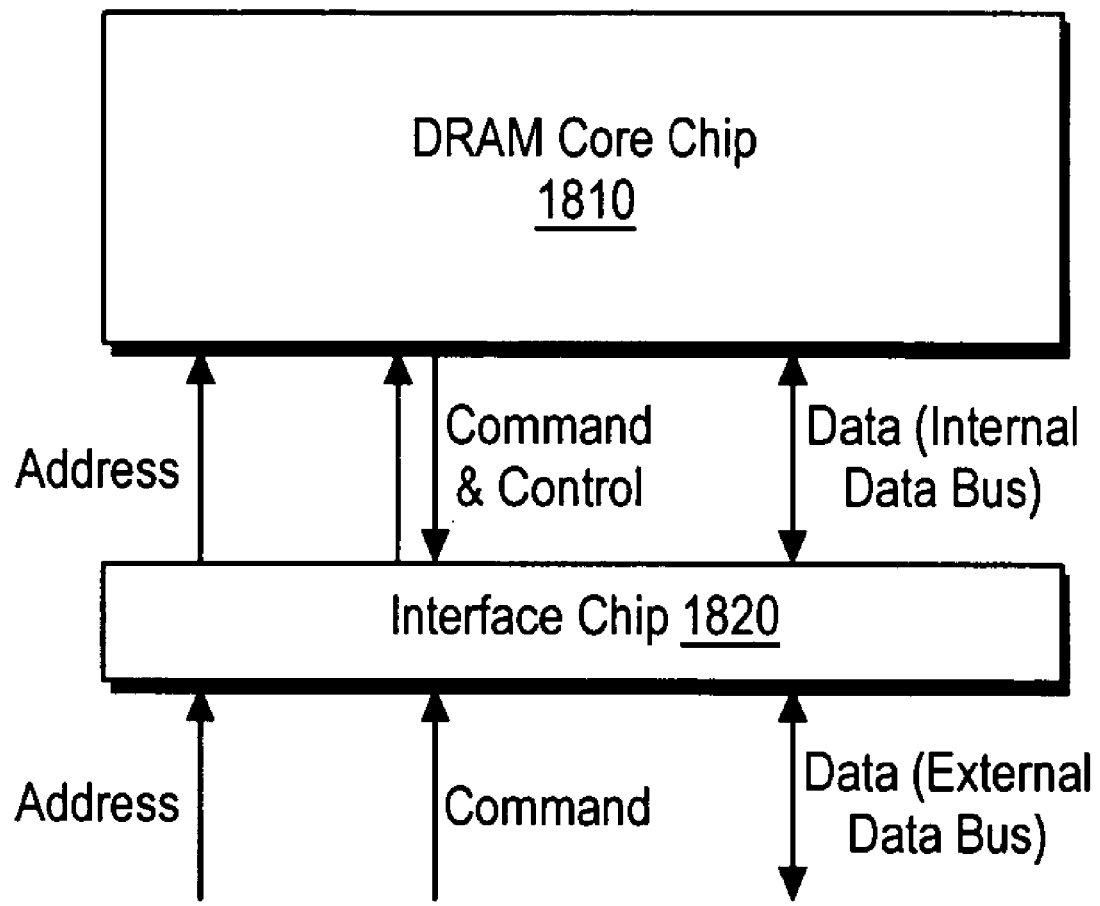
FIG. 18 is a block diagram illustrating an example multi-chip memory implementation.

FIG. 18 is a block diagram illustrating an example multi-chip memory implementation. The solution includes a DRAM core chip 1810 and an interface chip 1820. In some embodiments, the main characteristics of the DRAM core chip of this invention are:

Asynchronous or synchronous DRAM that is capable of stand-alone operation;

A plurality of DRAM core chips may be coupled together with one or more interface chips;

A plurality of interface chips may be coupled together with one or more DRAM core chips;

The interface on the DRAM core chip may include a custom and/or industry standard interface;

Has address inputs (bank address, row address, column address—row and column address can be on separate inputs or multiplexed on same pins);

Has command inputs like address strobes, read/write, output enable, and data masks);

Has control inputs that determine mode of operation—examples are inputs that determine the width of the internal data bus (bus between the memory core chip and interface chip) and inputs that determine the strength of the output drivers;

Has control outputs that determine some aspect of the functions performed by the interface chip;

Internal data bus width $\geq$ external data bus width (bus from interface chip to memory controller or ASIC);

Optional burst mode capability;

Adjustable drive strength on output drivers;

Capable of well-defined standard operations like Read, Write, Activate, Precharge, and Refresh that can be clearly characterized in terms of speed; and May be tested, burnt in, and speed binned independently (i.e. in stand-alone mode).

In some embodiments, the main characteristics of the interface chip of this invention are:

Implements the protocol used by the memory controller;

Interface chip implements an industry standard protocol like DDR SDRAM, DDR2 SDRAM, GDDR2 SDRAM, etc.;

Interface chip implements an industry standard protocol with custom extensions (e.g. GDDR2 SDRAM with extensions as specified by mutual agreement with one or more customers);

Interface chip implements a fully custom protocol as specified by one or more customers or a fully custom protocol developed in-house;

Interface chip operates as a transformer to convert protocols from the external interface to the interface of the DRAM core chip (e.g., synchronous to asynchronous and asynchronous to synchronous);

Interface chip determines the signaling used by the external interface;

For example, single ended, pseudo-differential, fully differential;

For example, push-pull outputs, open drain/collector outputs;

For example, asynchronous, synchronous, source synchronous, SerDes-like where clock is encoded/embedded in the data stream;

Determines the width of the external data bus;

Determines the speed of operation of the memory chip (by memory chip, we mean the combination of the DRAM core chip and the interface chip);

Determines the pin out of the memory chip as seen by the external world;

Allows the pin out of the memory chip to better match the pin out of the ASIC/memory controller to reduce the board routing complexity;

Implements special or custom functions and modes of operation;

Example, special power management functions and operating modes; and

Example, special error detection and error correction capabilities, as well as other types of redundancy capabilities and functions.

The DRAM core chip and the interface chip of this invention may be attached together in a number of different ways:

One or more DRAM core chip dies and one or more interface chip dies may be electrically connected to each other and the whole combination be put into a single package (e.g., a single DRAM core chip die with a single interface chip die, multiple DRAM core chip dies with a single interface chip die, or a single DRAM core chip die with multiple interface chip dies).

The core chip die may be put in a separate package, and then the interface chip die may then be electrically attached to the package containing the core chip die;

The interface chip die may be put in a separate package, and then the core chip die may then be electrically attached to the package containing the interface chip die;

The core chip die can be put in a separate package; the interface chip die may be put in a separate package; and the two packages can be electrically attached to each other;

Multiple DRAM core chip dies may be put in a separate package; the interface chip die may be put in a separate package; and the two packages can be electrically attached to each other;

A DRAM core chip die may be put in a separate package; multiple interface chip dies may be put in a separate package; and the two packages can be electrically attached to each other;

The DRAM core chip die and the interface chip die may be electrically attached in any way without deviating from the spirit or scope of the invention.

One aspect of this invention is that a multi-chip DRAM that is built according to this invention, might have higher cost than a traditional DRAM, especially if the DRAM core chip die and the interface chip die were packaged separately and then attached to each other. This is due to the cost associated with the extra package. One way to ameliorate this is to put multiple DRAM core chip dies in a single package. For the purpose of this discussion, we shall consider putting two DRAM core chip dies in a single package, each die being a 256 Mb density device. A typical DRAM manufacturing process might have the following sequences after the wafer has been fully processed:

DRAM dies on a wafer are tested at low speed and dies with defective rows and/or columns are marked;

The defective rows and/or columns are replaced with redundant rows and/or columns;

Wafer is diced into individual dies, which are then packaged;

Packaged parts are tested for functionality—parts damaged by the packaging process are eliminated;

Tested packaged parts undergo long term burn in to eliminate infant mortality parts; and Burnt in parts are optionally tested again for functionality and shipped.

So, if we place two 256 Mb DRAM core dies in a single package, the following 3 bins may be generated after the parts have been packaged and burnt-in:

Bin A—both the DRAM core chip dies are functional, so the total capacity is 512 Mb Bin B—only one of the DRAM core chip dies is functional, so the total capacity is 256 Mb Bin C—neither of the DRAM core chip dies is functional, so the total capacity is 0 Mb The bin C parts should be discarded. We can now use the bin B parts for those markets and/or customers who require only 256 Mb devices. For example, a handheld device manufacturer might require only a 256 Mb DRAM. So, the bin B parts can be attached to the interface chips designed for this manufacturer. Other markets and/or manufacturers might require 512 Mb devices. For example, a network router manufacturer might need 512 Mb DRAMs. So, we can use bin A parts for this manufacturer by attaching the appropriate interface chips to the bin A parts. This concept can be extended to cover more than two DRAM core chip dies in a single package as well as DRAM core chip dies of all densities.

Figure 19:
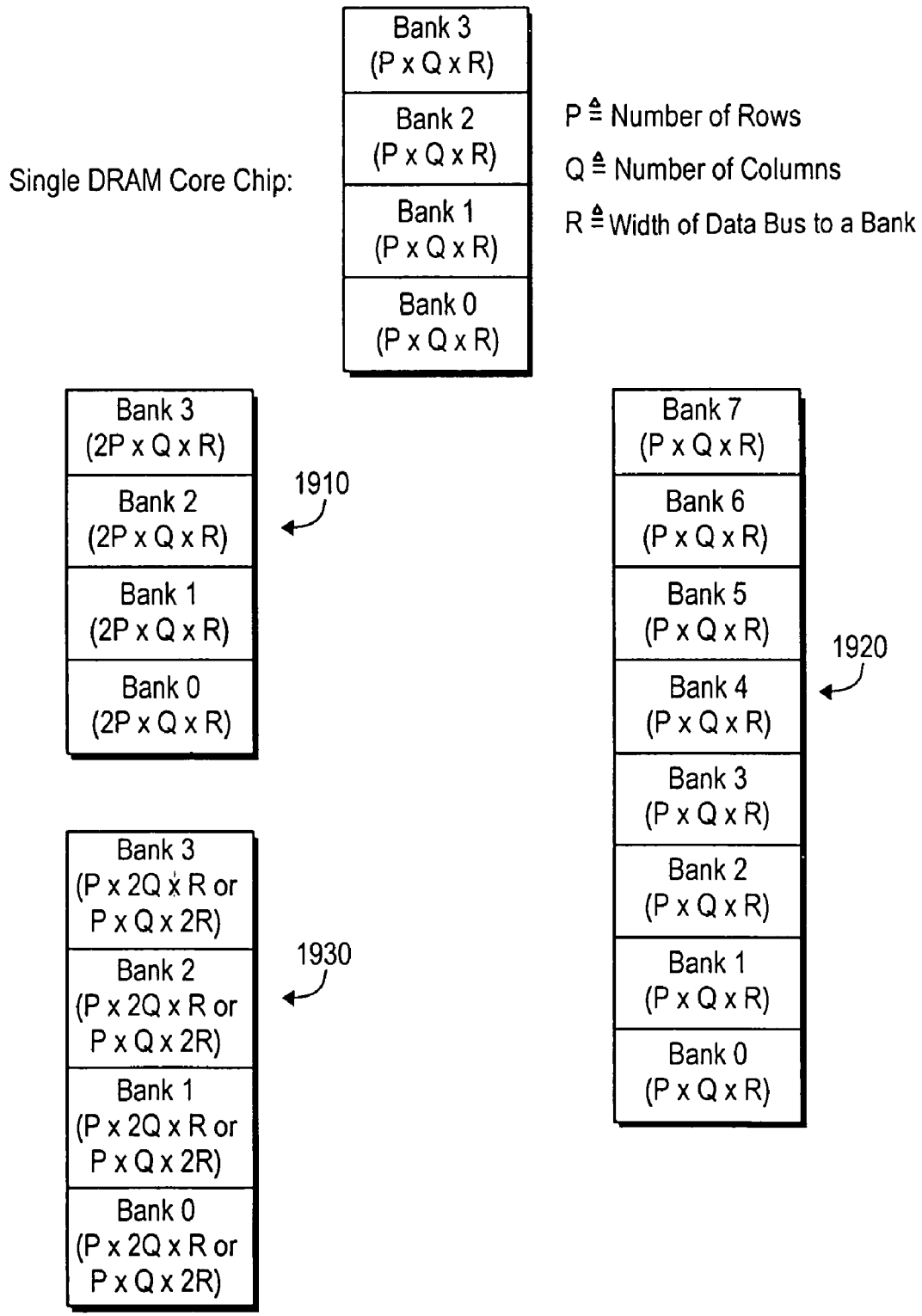
FIG. 19 illustrates techniques for stacking two DRAM core chips behind a single interface chip.

As disclosed above, some embodiments cover the idea of attaching multiple DRAM core chips to a single interface chip. The core chips may be attached to the interface chip in a number of different ways. Some of these ways are described below and in FIG. 19. Again, for the purpose of illustration, we shall assume that two 4-bank 256 Mb DRAM core chips (FIG. 11) are attached to the interface chip. Each of the core chips has a 64-bit wide data bus designed to connect to the interface chip. Note that the idea explained below can be applied to DRAM core chips with different number of banks, density, data bus width, etc.

In one method (1910), the row addresses are used to select the DRAM core chip. In a second method (1920), bank addresses are used to select DRAM core chips. In a third method (1930), the column addresses are used to select the DRAM core chip.

The two DRAM core chips are attached to the interface chip such that only one of the core chips is accessible at any given time. That is, the two core chips look to the electronic host system as a single 512 Mb DRAM with 4 banks. This implies that the interface chip will use the row address to select one or the other core chip.

The two DRAM core chips are attached to the interface such that both of the core chips are accessible at any given time, and that the two chips look to the external world electronic host system as a single 512 Mb DRAM with 8 banks. This implies that the interface chip will use the bank address to select one or the other core chip.

The two DRAM core chips are attached to the interface chip such that both of the core chips are accessible at any given time, and that the two chips look to the electronic host system as a single 512 Mb DRAM with 4 banks. The interface chip uses the column address to select one or the other core chip. Note that in other embodiments an interface chip always accesses both the core chips in parallel, so that the data bus between the core chips and the interface chip becomes 128-bits wide. For this embodiment, the interface chip doubles the external data rate. In other words, the amount of pre-fetching has been doubled.

In other embodiments the multi-chip solution is configured such that the attachment of the DRAM core chips to the interface chip is programmable. For example, the customer may choose between one of the three methods listed above to attach two 4-bank, 64-bit wide, 256 Mb DRAM core chips to an interface chip by programmable means. These means include using fuses on the interface chip or the core chips, pull-up or pull-down resistors on the package substrates or printed circuit board, or by means of a register on the interface chip or core chips. However, any way of attaching the DRAM core chips to the interface chip may be accomplished without deviating from the spirit or scope of the invention.

Other embodiments of the invention include building redundant memory systems by attaching multiple DRAM core chips to an interface chip. For example, when more than one core chip is attached to an interface chip, redundancy is added by several means including:

Storing identical copies of the data in corresponding locations of each core chip when data is written to the memory by the memory controller; when the data is read back by the memory controller, the interface chip can read the multiple copies of the data from the different core chips and select the correct copy and transmit it to the memory controller. The correct copy can be determined by means like majority voting, and/or by the use of parity or ECC bits;

Using (n+m) bits to store n data bits.

Another aspect of this invention is placing memory core chips of different types behind a common interface chip. For example, we can place any combination of DRAM core, SRAM (Static Random Access Memory), and Flash chips behind a common interface chip. Multi-Chip Package (MCP) memory solutions are fairly common in the cell phone and handheld markets today. The issue with current MCP solutions is that each of these memories (DRAM, SRAM, Flash) has different interfaces, which complicates the design of the memory controller, the packaging, and the board routing. Placing any possible combination of DRAM core chip, SRAM, and Flash behind a common interface chip simplifies the memory controller design since the idiosyncrasies of each of these memory types is hidden from the memory controller. In addition, the board routing is simplified.

Another aspect of this invention is placing a large and slow memory as well as a smaller and faster memory behind a common interface chip and using the faster memory as a cache for the slower memory. For example, an SRAM chip might be used as the cache for a DRAM core chip or a DRAM core chip can be used as the cache for a Flash chip. The cache management logic may be built into the interface chip so that the cache is transparent to the memory controller. Alternately, the cache may be made visible to the memory controller and managed by the memory controller. Let us consider the case of an interface chip that has been designed to interface to one or more DRAM core chips and an SRAM chip. The SRAM chip can be used to cache the rows in the DRAM core chips that were recently opened. The SRAM may be used to cache the entire contents of the recently opened rows in the DRAM or cache part of the contents of the recently opened rows in the DRAM. The properties of the cache (associatively of the cache lines, mapping between DRAM rows and SRAM cache lines, etc.) may be determined by programming certain registers in the interface chip. By storing data that has a high likelihood of being accessed in the near future, system performance is improved.

Using a cache also allows the interface chip to do speculative pre-fetching of data from the DRAM core chip (and storing it in the SRAM cache chip), which again improves system performance. In addition, the interface chip may operate with SRAM chips (that are used as caches) of different densities. This allows the same interface chip to be used across several different segments within a market. For example, a DRAM/SRAM combination memory device may includes a common interface where the DRAM capacity is 512 Mb and the SRAM capacity ranges from 0 to 32 Mb. This allows a DRAM supplier to ship the 512 Mb DRAM+32 Mb SRAM combination in the high performance segment of the market, ship a 512 Mb DRAM+8 Mb SRAM combination in the mainstream segment of the market, and ship a 512 Mb DRAM (no SRAM cache) device in the value segment of the market.

The techniques of the present invention are not just applicable to DRAM. As such, the DRAM core chip need not necessarily be a trench-capacitor or stacked-capacitor device. The present invention is applicable to a variety of memory technologies like MRAM (Magnetic RAM), FRAM (Ferroelectric RAM), Ovonics memory, molecular memory (e.g. memory technology developed by ZettaCore), carbon nanotube memory (e.g. memory technology developed by Nantero Inc.), etc.

Another aspect of this invention is that it can be used with DRAM core chips that have different architectures like FCRAM (Fast Cycle RAM), RLDRAM (Reduced Latency DRAM), ESDRAM (Enhanced SDRAM).

Some embodiments of invention allow the use of a common memory core across a wide range of markets while varying the interface of the memory core according to the market and customer needs. It also allows the interface to be kept constant while changing the memory core behind the interface to address the needs of the different segments within a market.

Although the present invention has been described in terms of specific exemplary embodiments, it will be appreciated that various modifications and alterations might be made by those skilled in the art without departing from the spirit and scope of the invention.

What is claimed is:

1. A memory device for use with an external circuit, the memory device comprising:
   at least one first integrated circuit die including,
   a memory core comprising a plurality of memory cells, and
   a first interface circuit including a first interface for accessing the memory cells of the memory core and configuring a data rate for transferring data between the memory cells and the first interface circuit; and
   at least one second integrated circuit die, electrically coupled to the first integrated circuit die, comprising a second interface for accessing the memory core via the first interface circuit and for interfacing the memory core to the external circuit.

2. The memory device as set forth in claim 1, further comprising:
   a plurality of the first integrated circuit dies.

3. The memory device as set forth in claim 1, further comprising:
   a plurality of the second integrated circuit dies.

4. A memory device for use with an external circuit, the memory device comprising:
   at least one first integrated circuit die including,
   a memory core comprising a plurality of memory cells, and
   a first interface circuit including a first interface for accessing the memory cells of the memory core;
   at least one second integrated circuit die, electrically coupled to the first integrated circuit die, comprising a second interface for accessing the memory core via the first interface circuit and for interfacing the memory core to the external circuit;
   a first package housing the at least one first integrated circuit die; and
   a second package housing the at least one second integrated circuit die.

5. The memory device as set forth in claim 1, further comprising:
   a single package housing the first and second integrated circuit dies.

6. A memory device for use with an external circuit, the memory device comprising:
   at least one first integrated circuit die including,
   a memory core comprising a plurality of memory cells, and
   a first interface circuit including a first interface for accessing the memory cells of the memory core;
   a plurality of second integrated circuit dies, electrically coupled to the first integrated circuit die, comprising a second interface for accessing the memory core via the first interface circuit and for interfacing the memory core to the external circuit; and a single package housing the at least one first integrated circuit die and housing the plurality of second integrated circuit dies.

7. A memory device for use with an external circuit, the memory device comprising:

a plurality of first integrated circuit dies including,
a memory core comprising a plurality of memory cells, and
a first interface circuit including a first interface for accessing the memory cells of the memory core;

at least one second integrated circuit die, electrically coupled to the plurality of first integrated circuit dies, comprising a second interface for accessing the memory core via the first interface circuit and for interfacing the memory core to the external circuit; and a single package housing the plurality of the first integrated circuit dies and housing the at least one second integrated circuit die.

8. A memory device for use with an external circuit, the memory device comprising:

a plurality of first integrated circuit dies including,
a memory core comprising a plurality of memory cells, and
a first interface circuit including a first interface for accessing the memory cells of the memory core;

at least one second integrated circuit die. electrically coupled to the plurality of first integrated circuit dies, comprising a second interface for accessing the memory core via the first interface circuit and for interfacing the memory core to the external circuit;

a first package for housing the plurality of the first integrated circuit dies; and a second package for housing the at least one second integrated circuit die.

9. A memory device for use with an external circuit, the memory device comprising:

at least one first integrated circuit die including,
a memory core comprising a plurality of memory cells, and
a first interface circuit including a first interface for accessing the memory cells of the memory core;

at least one second integrated circuit die, electrically coupled to the first integrated circuit die, comprising a second interface for accessing the memory core via the first interface circuit and for interfacing the memory core to the external circuit;

wherein the second interface of the at least one second integrated circuit die is further for converting protocols between the external circuit and the first interface of the first integrated circuit die.

10. The memory device as set forth in claim 9, wherein:
the protocols comprise,
a first protocol, and
a second protocol which is different from the first protocol.

11. The memory device as set forth in claim 10, wherein:
the first protocol comprises a synchronous protocol; and
the second protocol comprises an asynchronous protocol.

12. The memory device as set forth in claim 10, wherein:
the first protocol comprises a custom protocol; and
the second protocol comprises an industry standard protocol.

13. The memory device as set forth in claim 1, wherein:
the first interface circuit is further for providing a read operation to the memory cells.

14. The memory device as set forth in claim 1, wherein:
the first interface circuit is further for providing a write operation to the memory cells.

15. The memory device as set forth in claim 1, wherein:
the first interface circuit is further for providing activating, pre-charging and refreshing operations to the memory cells.

16. The memory device as set forth in claim 1, wherein the first integrated circuit die comprises:
a plurality of memory banks for partitioning the memory cells.

17. The memory device as set forth in claim 16, wherein the memory banks comprise:
a plurality of sub-arrays arranged in a distributed bank architecture across a plurality of physical sections such that a physical section of the memory cells comprises a plurality of sub-arrays associated with different ones of the memory banks.

18. The memory device as set forth in claim 1, wherein the memory cells comprise:
at least one non-volatile memory cell.

19. The memory device as set forth in claim 1, wherein the memory cells comprise:
at least one volatile memory cell.

20. A memory device for use with an external circuit, the memory device comprising:

a first integrated circuit die including,
a memory core including a plurality of memory cells, and
a first interface circuit having a first interface and coupled to the memory cells, for dynamically configuring an internal data rate for transferring data between the memory cells and the first interface circuit; and a second integrated circuit die, electrically coupled to the first integrated circuit die, including a second interface for accessing data from the memory core via the first interface circuit and for interfacing said memory core to the external circuit.

21. The memory device as set forth in claim 20, wherein:
the memory device further comprises an internal data bus for coupling data between the first integrated circuit die and the second integrated circuit die; and
the internal data bus has a configurable data width.

22. The memory device as set forth in claim 20, wherein the internal data rate comprises:
a configurable amount of data for pre-fetching.

23. The memory device as set forth in claim 20, wherein the first integrated circuit die further comprises:
at least one input for programming said data width for said internal data bus.

24. The memory device as set forth in claim 20, further comprising:
an external data bus, having an external data rate, for accessing data external to the memory device, wherein the internal data rate can be dynamically selected so as to be compatible with the external data rate.

25. The memory device as set forth in claim 9, wherein said second interface of said second integrated circuit die for converting between a DDR2 SDRAM protocol and a DDR3 SDRAM protocol.

26. The memory device as set forth in claim 9, wherein said second interface of said second integrated circuit die for converting between a first timing specification of a DDR2 SDRAM protocol and a second timing specification of a DDR2 SDRAM protocol.

27. The memory device as set forth in claim 1, wherein the data rate is an internal data rate.

* * * * *